US009666595B2

(12) United States Patent
Sawabe et al.

(10) Patent No.: US 9,666,595 B2
(45) Date of Patent: May 30, 2017

(54) SEMICONDUCTOR MEMORY DEVICE AND METHOD OF MANUFACTURING THE SAME

(71) Applicant: KABUSHIKI KAISHA TOSHIBA, Minato-ku (JP)

(72) Inventors: Ryosuke Sawabe, Yokkaichi (JP); Hanae Ishihara, Yokkaichi (JP); Masaru Kito, Kuwana (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 14/865,873

(22) Filed: Sep. 25, 2015

(65) Prior Publication Data

US 2016/0268300 A1    Sep. 15, 2016

Related U.S. Application Data

(60) Provisional application No. 62/132,234, filed on Mar. 12, 2015.

(51) Int. Cl.

| H01L 27/10 | (2006.01) |
|---|---|
| H01L 27/11582 | (2017.01) |
| H01L 27/11578 | (2017.01) |
| H01L 27/11551 | (2017.01) |
| H01L 27/11514 | (2017.01) |
| H01L 27/11575 | (2017.01) |
| H01L 27/11556 | (2017.01) |
| H01L 21/28 | (2006.01) |
| H01L 27/11548 | (2017.01) |

(52) U.S. Cl.
CPC .. H01L 27/11582 (2013.01); H01L 21/28282 (2013.01); H01L 27/11514 (2013.01); H01L 27/11551 (2013.01); H01L 27/11575 (2013.01); H01L 27/11578 (2013.01); H01L 21/28273 (2013.01); H01L 27/11548 (2013.01); H01L 27/11556 (2013.01); H01L 2924/1438 (2013.01)

(58) Field of Classification Search
CPC ......... H01L 27/11582; H01L 27/11556; H01L 27/11551; H01L 27/11578; H01L 27/11514; H01L 2924/1438
See application file for complete search history.

(56) References Cited

U.S. PATENT DOCUMENTS

| 6,955,972 B2 | 10/2005 | Lee et al. | |
|---|---|---|---|
| 2011/0199825 A1* | 8/2011 | Han | G11C 16/10 365/185.11 |

FOREIGN PATENT DOCUMENTS

| JP | 2002-208631 | 7/2002 |
|---|---|---|
| JP | 3309960 | 7/2002 |
| JP | 2007-129254 | 5/2007 |

* cited by examiner

Primary Examiner — Fei Fei Yeung Lopez
(74) Attorney, Agent, or Firm — Oblon, McClelland, Maier & Neustadt, L.L.P.

(57) ABSTRACT

A semiconductor memory device includes a first layer, a plurality of memory areas, a plurality of contact wires, a first shunt wire, and a second shunt wire. The memory areas are provided on the first layer in a first direction. The contact wires have a longitudinal direction in a second direction perpendicular to the first layer. The contact wires are provided between the adjacent memory areas on the first layer in a third direction intersecting the first direction. The first shunt wire commonly connects the contact wires. The second shunt wire extends in the first direction and is electrically connected to the first shunt wire.

13 Claims, 20 Drawing Sheets

SEMICONDUCTOR MEMORY DEVICE AND METHOD OF MANUFACTURING THE SAME

CROSS REFERENCE TO RELATED APPLICATIONS

This application is based on and claims the benefit of priority from prior U.S. prior provisional Patent Application No. 62/132,234, filed on Mar. 12, 2015, the entire contents of which are incorporated herein by reference.

FIELD

The embodiments described below relate to a semiconductor memory device and a method of manufacturing the same.

BACKGROUND

Description of the Related Art

In the field of a NAND flash memory, a stacked (three-dimensional) NAND flash memory has recently drawn attention.

BRIEF DESCRIPTION OF THE DRAWINGS

FIG. 4 is a perspective cross-sectional view of one memory cell MC or the like.

DETAILED DESCRIPTION

A semiconductor memory device according to the embodiments described below includes a first layer, a plurality of memory areas, a plurality of contact wires, a first shunt wire, and a second shunt wire. The memory areas are provided on the first layer in a first direction. The contact wires have a longitudinal direction in a second direction perpendicular to the first layer and are provided between the adjacent memory areas on the first layer in a third direction intersecting the first direction. The first shunt wire commonly connects the contact wires. The second shunt wire extends in the first direction and is electrically connected to the first shunt wire.

The non-volatile semiconductor memory device and a method of manufacturing the same according to the embodiments are described below in more detail with reference to the drawings.

Note that the following embodiments relate to a non-volatile semiconductor memory device having a structure in which a plurality of Metal-Oxide-Nitride-Oxide-Semiconductor (MONOS) memory cells (transistors) are provided in the height direction. Each MONOS memory cell includes a semiconductor film provided in a columnar shape perpendicularly to the substrate, the semiconductor film working as a channel, and includes a gate electrode film provided on a side surface of the semiconductor film via a charge accumulation layer. However, this is not intended to limit the present invention, and the present invention is applicable to other types of charge accumulation films such as a Semiconductor-Oxide-Nitride-Oxide-Semiconductor (SONOS) memory cell and a floating gate memory cell.

First Embodiment

Figure 1:
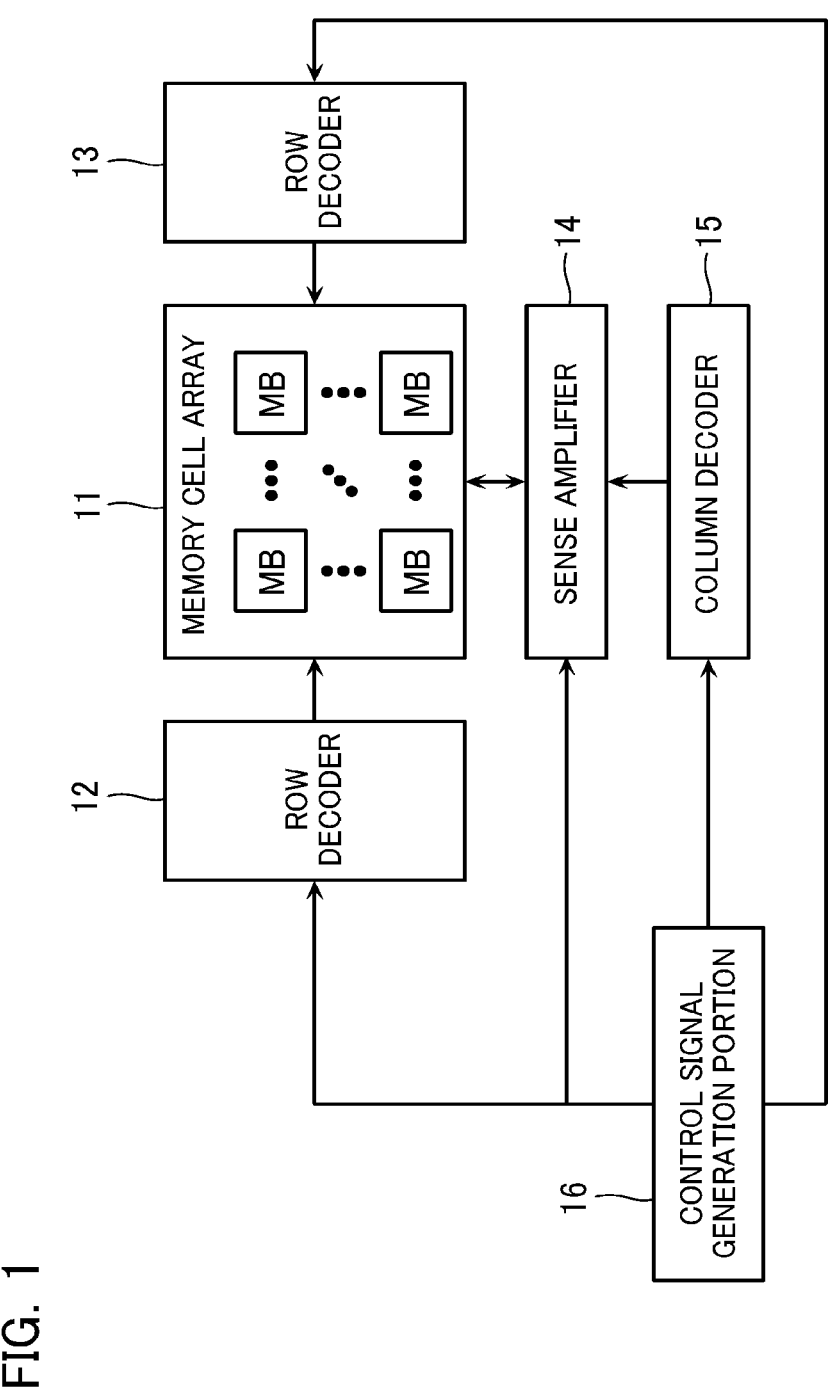
FIG. 1 is a block diagram of a non-volatile semiconductor memory device according to a first embodiment.

FIG. 1 is a block diagram of a non-volatile semiconductor memory device according to a first embodiment.

The non-volatile semiconductor memory device according to the first embodiment includes, as shown in FIG. 1, a memory cell array 11, row decoders 12 and 13 that control the reading and writing of the memory cell array 11, a sense amplifier 14, a column decoder 15, and a control signal generation portion 16.

The memory cell array 11 includes a plurality of memory blocks MB. Each memory block MB includes a plurality of memory cells MC that store data in a non-volatile manner and are arranged three-dimensionally. Each memory block MB thus forms a minimum erase unit that is collectively erased in the data erase operation. The memory cells MC are arranged in a matrix (three-dimensionally) in the row, column, and stacking directions.

The row decoders 12 and 13 decode, as shown in FIG. 1, a captured block address signal or the like and control the memory cell array 11. The sense amplifier 14 reads data from the memory cell array 11. The column decoder 15 decodes a column address signal and controls the sense amplifier 14. The control signal generation portion 16 increases the reference voltage to generate a high voltage necessary in the writing and erasing. The control signal generation portion 16 also generates a control signal to control the row decoders 12 and 13, the sense amplifier 14, and the column decoder 15.

Figure 2:
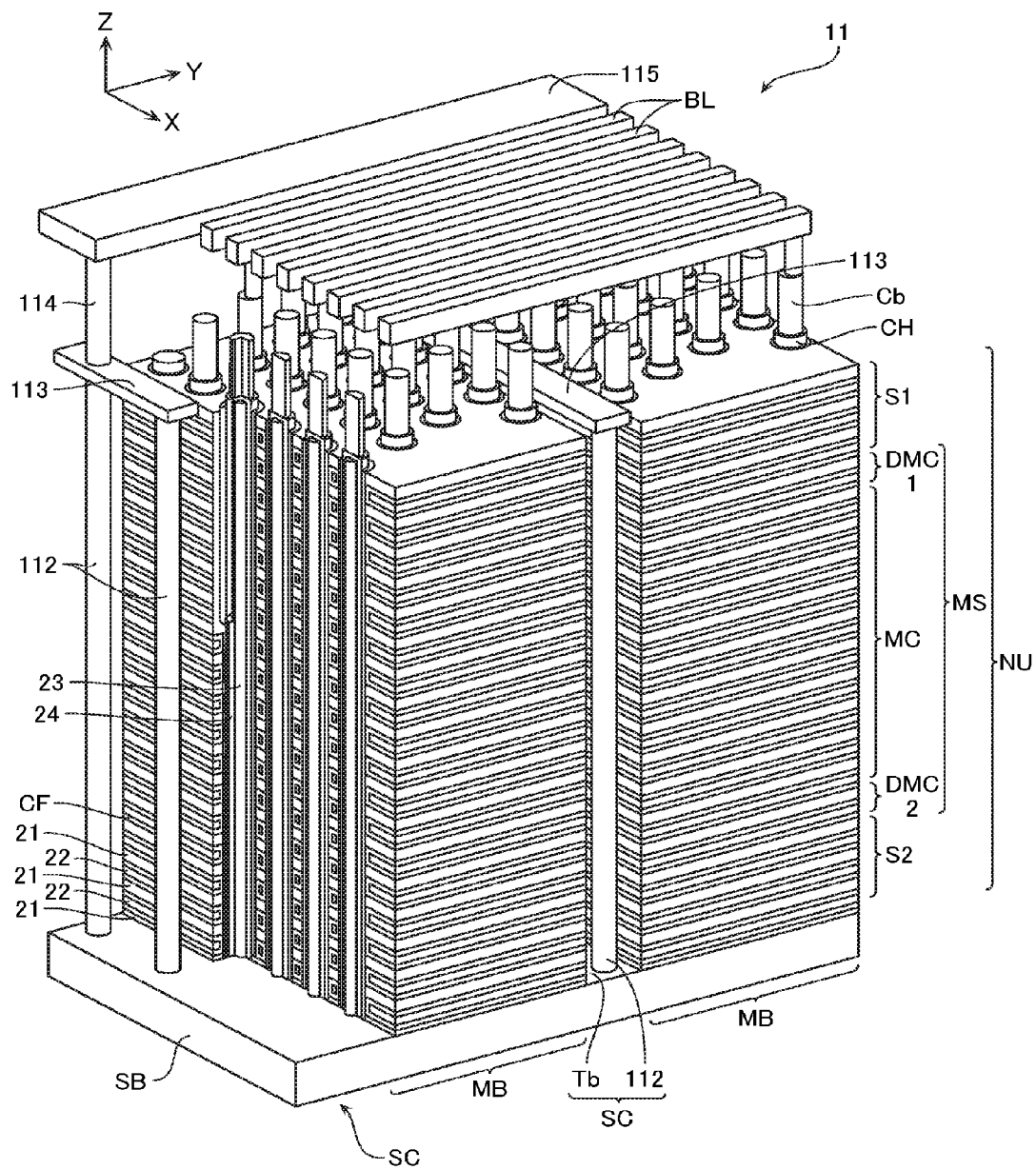
FIG. 2 is a perspective view partially showing the structure of a memory cell array 11.
Figure 3:
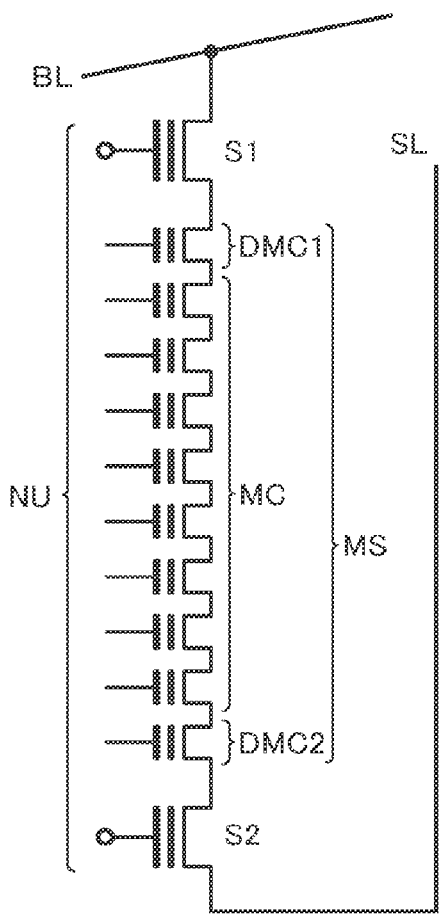
FIG. 3 is an equivalent circuit diagram of one NAND cell unit NU.
Figure 4:
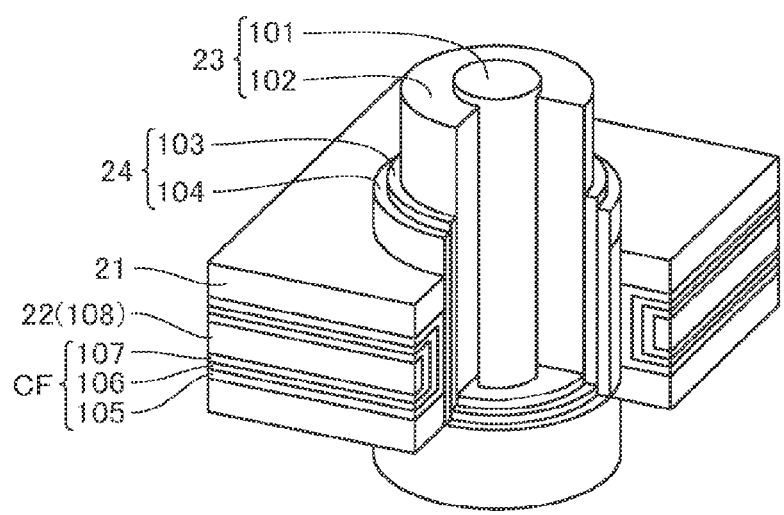

Next, the structure of the memory cell array 11 is described with reference to FIGS. 2 to 5. FIG. 2 is a perspective view partially showing the structure of the memory cell array 11. FIG. 3 is an equivalent circuit diagram of one NAND cell unit NU. FIG. 4 is a perspective cross-sectional view of one memory cell MC or the like.

As shown in FIG. 2, the memory cell array 11 has a structure in which a semiconductor substrate SB bears an alternating stack of interlayer dielectric films 21 and conductive films 22. The conductive films 22 function as control gates (word-lines WL), source-side select gate lines SGS, and drain-side select gate lines SGD of the memory cells MC. The interlayer dielectric films 21 are disposed above and below the conductive films 22 to electrically isolate the conductive films 22.

The conductive films 22 may be formed of, for example, tungsten (W), tungsten nitride (WN), tungsten silicide (WSi$_x$), tantalum (Ta), tantalum nitride (TaN), tantalum silicide (TaSi$_x$), palladium silicide (PdSi$_x$), erbium silicide (ErSi$_x$), yttrium silicide (YSi$_x$), platinum silicide (PtSi$_x$), hafnium silicide (HfSi$_x$), nickel silicide (NiSi$_x$), cobalt silicide (CoSi$_x$), titanium silicide (TiSi$_x$), vanadium silicide (VSi$_x$), chromium silicide (CrSi$_x$), manganese silicide (MnSi$_x$), iron silicide (FeSi$_x$), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or chemical compounds thereof. The conductive films 22 may also be formed of polysilicon doped with impurity.

Each conductive film 22 is surrounded by stacked films CF. Each stacked film CF includes a block insulating film 105, a block high dielectric film 106, and a barrier metal 107.

In addition, the stack of the interlayer dielectric films 21 and conductive films 22 are passed through by semiconductor layers 23. The semiconductor layers 23 have a longitudinal direction in the stacking direction (Z-direction) and are arranged in the X-Y plane at a certain pitch. Between each semiconductor layer 23 and the conductive and interlayer dielectric films 22 and 21, a memory film 24 is formed. Each memory film 24 includes a charge accumulation layer. Each memory film 24 may be formed of, as described below, a stacked structure having a charge accumulation film such as a silicon nitride film and an oxide film such as a silicon oxide film. The charge amount accumulated in the charge accumulation film changes the threshold voltage of the memory cells MC. The memory cells MC hold data corresponding to the threshold voltage.

The semiconductor layers 23 are configured to function as the channel regions (bodies) of the memory cells MC, dummy cells DMC1 and DMC2, and select transistors S1 and S2 included in the NAND cell unit NU. The semiconductor layers 23 are connected, at their upper ends, to bit-lines BL via upper and lower contacts Cb and CH. The bit-lines BL have a longitudinal direction in the Y-direction and are arranged in the X-direction at a certain pitch.

In addition, the semiconductor layers 23 have lower ends connected to the semiconductor substrate SB. As described below, the lower ends of the semiconductor layers 23 are connected to not-shown source-lines via the semiconductor substrate SB and the below described source contact lead-out portions SC and second shunt wires 115. The second shunt wires 115 are arranged, like the bit-lines BL, having a longitudinal direction in the Y-direction. In addition, the second shunt wires 115 are provided in the same wiring layer as the bit-lines BL. In other words, the second shunt wires 115 and the bit-lines BL have the same Z-direction position.

Note that the stack of the interlayer dielectric films 21 and conductive films 22 in the memory cell array 11 is divided for each memory block MB. The memory block MB is the minimum unit of the data erase. Each boundary between the divided portions has a trench Tb formed therein. Each trench Tb has a source contact lead-out portion SC formed therein.

As described below in more detail, each source contact lead-out portion SC includes a plurality of source contact wires 112, the source contact wires 112 being arranged in the X-direction at a certain distance and extending in the Z-direction, and a first shunt wire 113 commonly connecting the source contact wires 112 arranged in the X-direction. In addition, the first shunt wires 113 are in contact with contacts 114 extending in the Z-direction and are connected to the second shunt wires 115 via the contacts 114.

FIG. 3 is an equivalent circuit diagram of one NAND cell unit NU. In this memory cell array 11, one NAND cell unit includes a memory string MS, the memory string MS including the memory cells MC and the dummy cells DMC1 and DMC2, the drain-side select transistor S1 connected between the upper end of the memory string MS and the bit-lines BL, and the source-side select transistor S2 connected between the lower end of the memory string MS and the source-lines SL.

FIG. 4 shows an example of a specific structure of one memory cell MC or dummy cell DMC. The semiconductor layer 23 includes an oxide film core 101 and a semiconductor columnar portion 102 surrounding the core 101. The oxide film core 101 is formed of, for example, a silicon oxide film (SiO$_2$). The semiconductor columnar portion 102 is formed of, for example, silicon (Si), silicon germanium (SiGe), silicon carbide (SiC), germanium (Ge), or carbon (C), or the like.

The semiconductor columnar portion 102 is surrounded by a tunnel insulating film 103 and a charge accumulation layer 104. The tunnel insulating film 103 is formed of, for example, a silicon oxide film (SiO$_x$). The tunnel insulating film 103 functions as a tunnel insulating film of the memory cell MC or dummy cell DMC. The charge accumulation layer 104 is formed of, for example, a silicon nitride film (SiN). The charge accumulation layer 104 has a function of trapping electrons injected from the semiconductor columnar portion 102 via the tunnel insulating film 103 in the write operation. Although this example depicts that the tunnel insulating film 103 and the charge accumulation layer 104 are formed on the entire side surface of the semiconductor columnar portion 102, the invention is not limited thereto. The film 103 and the layer 104 may also be formed on only the side surfaces of the word-lines WL.

The side surface of the charge accumulation layer 104 is provided with an alternating stack of the above interlayer dielectric films 21 and tungsten electrodes 108 that function as the conductive films 22. Note, however, that each tungsten electrode 108 is surrounded by, from the outside to the inside, the block insulating film 105, the block high dielectric film 106, and the barrier metal 107. The block insulating film 105 may be formed of, for example, a silicon oxide film. In this example, the block insulating film 105 is formed surrounding the periphery of the tungsten electrode 108. The film 105 may also be formed on the entire side surface of the semiconductor columnar portion 102 like the tunnel insulating film 103 and the charge accumulation film 104.

Note that the tunnel insulating film 103 and the block insulating film 105 may be formed of materials including a silicon oxide film ($SiO_x$) as well as, for example, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, or the like.

Figure 5:
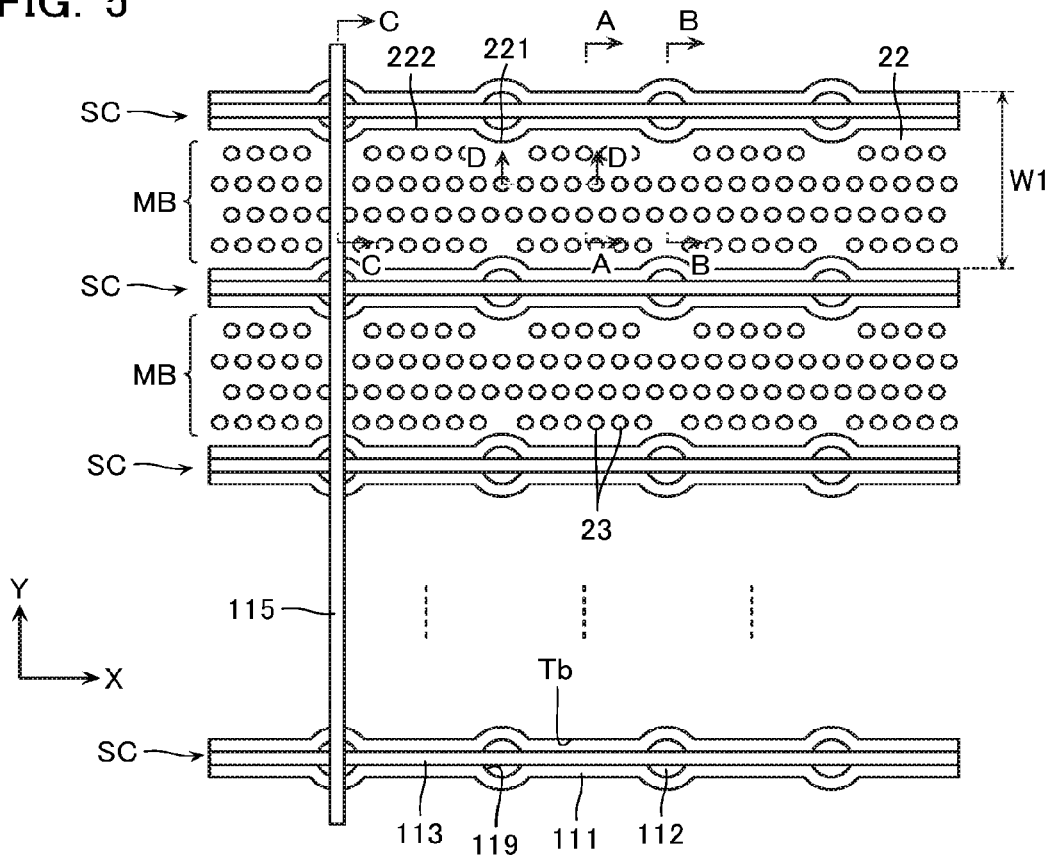
FIG. 5 is a schematic plan view of the semiconductor memory device according to this embodiment.
Figure 6:
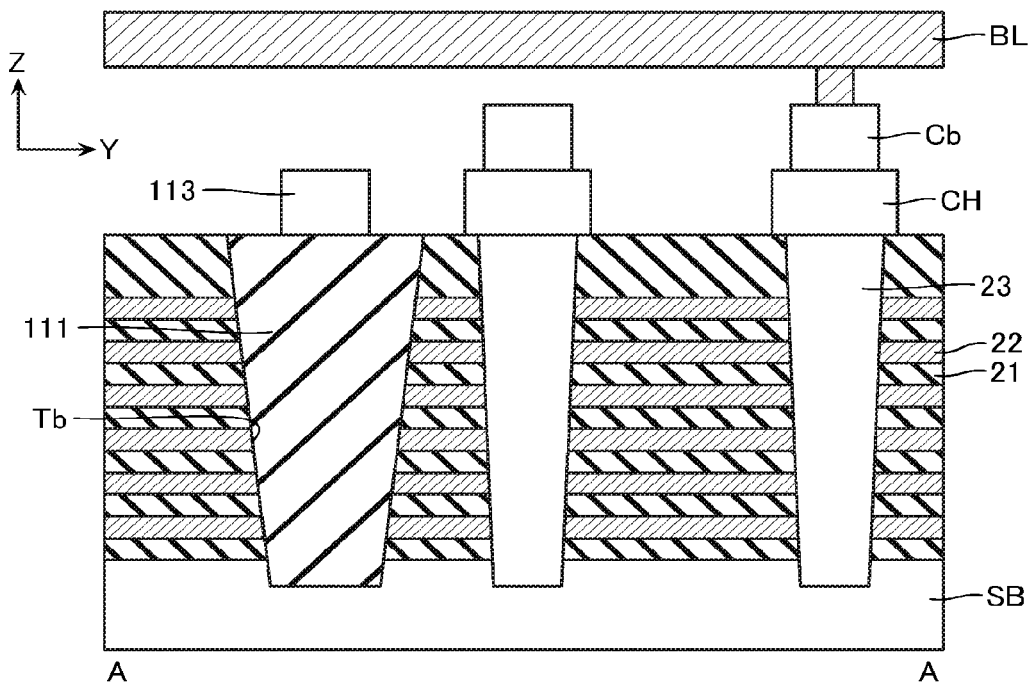
FIG. 6 is a cross-sectional view showing a section along A-A in FIG. 5.
Figure 7:
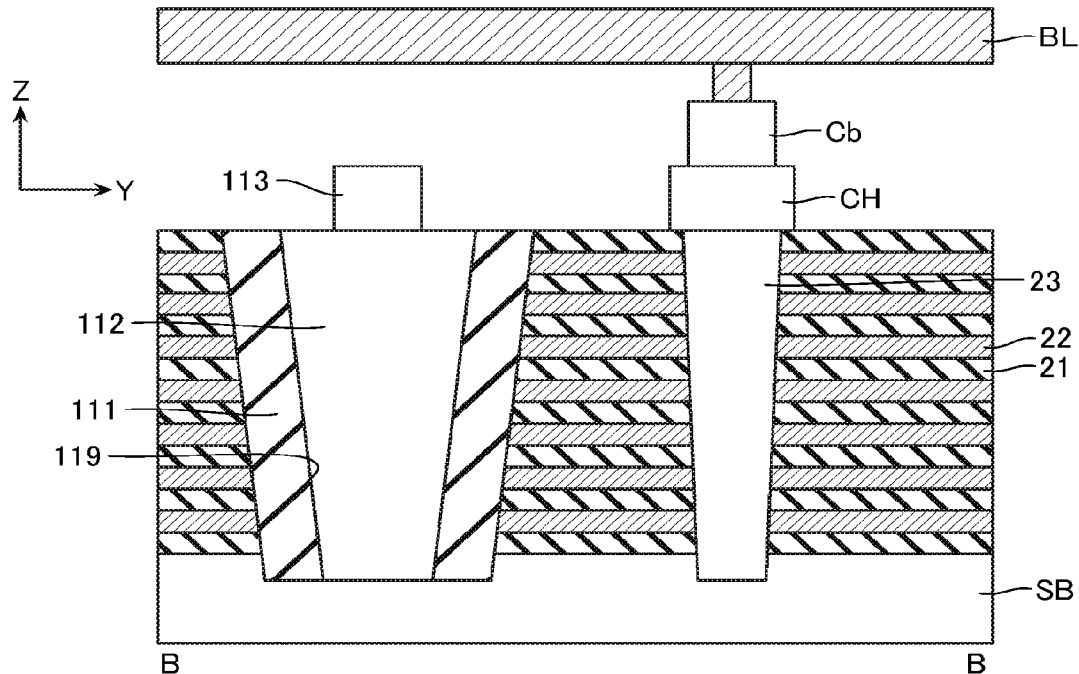
FIG. 7 is a cross-sectional view showing a section along B-B in FIG. 5.
Figure 8:
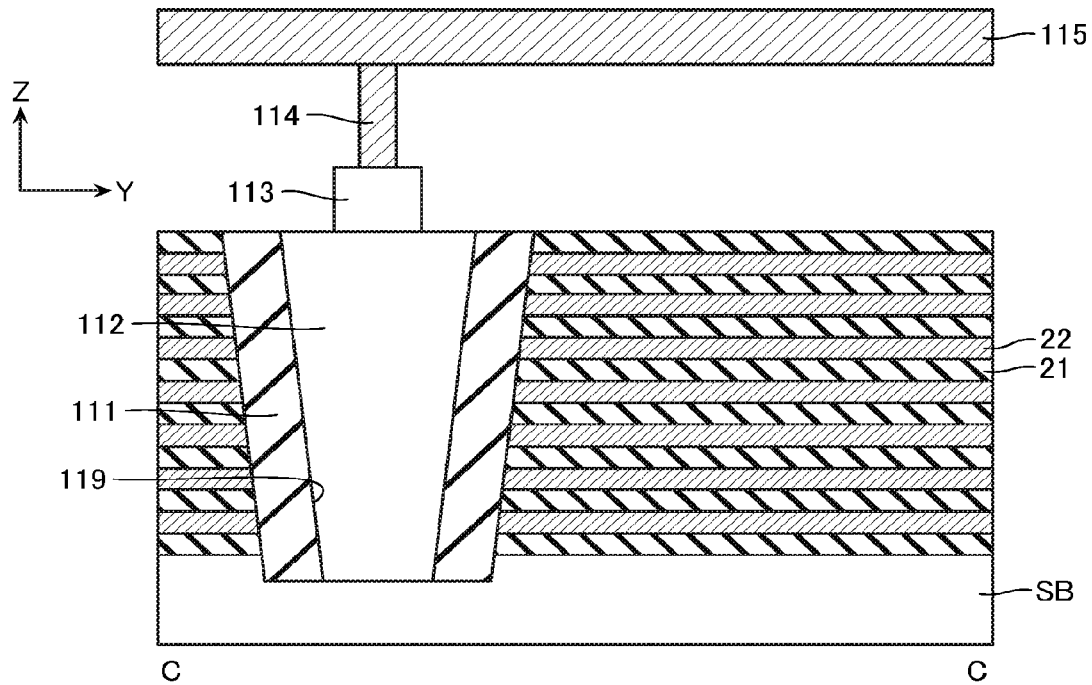
FIG. 8 is a cross-sectional view showing a section along C-C in FIG. 5.
Figure 9:
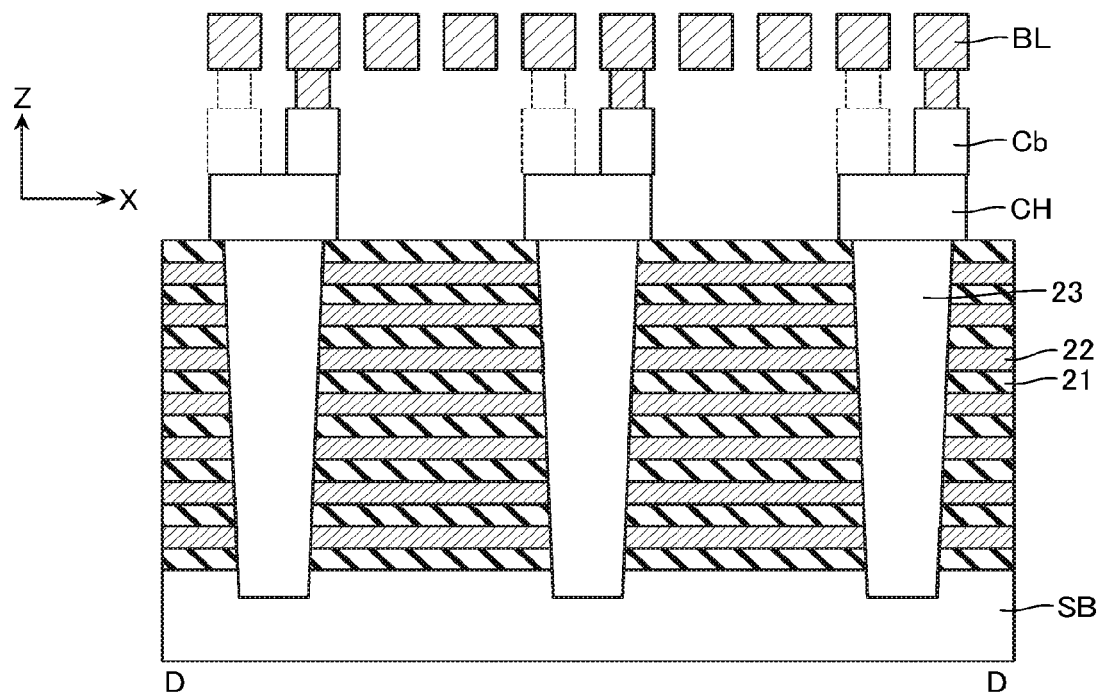
FIG. 9 is a cross-sectional view showing a section along D-D in FIG. 5.

Next, with reference to FIGS. 5 to 9, planar structures of the semiconductor memory device according to this embodiment will be described. FIG. 5 is a schematic plan view of the semiconductor memory device according to this embodiment. FIG. 6 is a cross-sectional view showing a section along A-A in FIG. 5. FIG. 7 is a cross-sectional view showing a section along B-B in FIG. 5. FIG. 8 is a cross-sectional view showing a section along C-C in FIG. 5. FIG. 9 is a cross-sectional view showing a section along D-D in FIG. 5. Note that for purposes of illustration, FIGS. 5 to 9 partially omit the configurations.

As shown in FIG. 5, the semiconductor memory device according to this embodiment includes an alternate arrangement of the memory blocks MB and source contact lead-out portions SC in the Y-direction. Each trench Tb formed between the memory blocks MB has a Y-direction width that is relatively wider near the source contact wires 112 and relatively narrower in the other portions. Therefore, assuming that for example, the memory blocks MB adjacent in the Y-direction are apart by a first distance in the portions where they are in an overlapping position with the source contact wires 112 in the X-direction and the memory blocks MB adjacent in the Y-direction are apart by a second distance in the portions where they are not in an overlapping position with the source contact wires 112 in the X-direction, the second distance is smaller than the first distance. Note that each trench Tb has a Y-direction width of, for example, about 150 nm to 400 nm near the source contact wires 112. In addition, each trench Tb has a Y-direction width of, for example, about 100 nm to 300 nm in the other portions.

As shown in FIG. 5, each memory block MB has the semiconductor layers 23 staggered in the X- and Y-directions. In addition, FIG. 5 shows an example where in each memory block MB, two semiconductor layers 23 have the same X-direction position. In addition, as shown in FIG. 9, one semiconductor layer 23 has two bit-lines BL formed thereabove. In addition, as shown in FIG. 9, the center position of the upper contact Cb is shifted in the X-direction relative to the center position of the semiconductor layer 23. As shown in FIG. 9, a first one of the adjacent semiconductor layers 23 in the X-direction is connected to a certain bit-line BL via the upper contact Cb positioned in the right portion on the top surface of the lower contact CH. On the other hand, a second one of the adjacent semiconductor layers 23 in the X-direction is connected to a different bit-line BL via the upper contact Cb (the upper contact Cb depicted by the dotted line in FIG. 9) positioned in the left portion on the top surface of the lower contact CH.

As shown in FIG. 5, each source contact lead-out portion SC is positioned between the adjacent memory blocks MB in the Y-direction, and extends in the X-direction along the Y-direction end surfaces of the memory blocks MB. In addition, as described above, each trench Tb formed between the memory blocks MB has a Y-direction width that is relatively wider near the source contact wires 112 and relatively narrower in the other portions. In other words, each conductive layer 22 has Y-direction end portions that are recessed in the vicinities 221 of the source-lines 112 and projected in the other portions 222. The semiconductor layers 23 are also disposed near the projected portions 222 of the conductive layers 22. Note that although in FIG. 5, the semiconductor layers 23 are staggered in the X- and Y-directions, the semiconductor layers 23 may be positioned differently as appropriate.

As shown in FIGS. 5 to 9, each source contact lead-out portion SC includes the source contact wires 112, the source contact wires 112 being arranged in the X-direction at a certain distance and extending in the Z-direction, and the first shunt wire 113, the first shunt wire 113 commonly connecting the upper ends of the source contact wires 112 arranged in the X-direction. In addition, each trench Tb formed between the memory blocks MB has an interblock insulating layer 111 embedded therein.

As shown in FIG. 5, the source contact wires 112 are arranged in the trench Tb in the X-direction at a certain distance. In addition, as shown in FIG. 7, the source contact wires 112 are in contact with the substrate SB at their lower ends and with the contact connection wiring lines 113 at their upper ends.

As shown in FIGS. 5, 7, and 8, the source contact wires 112 are formed, in this embodiment, in a columnar shape having a longitudinal direction in the Z-direction. In addition, FIGS. 7 and 8 show examples where the source contact wires 112 are tapered so that they are narrower on the substrate SB side and thicker on the contact connection wiring line 113 side. Note that the source contact wires 112 are formed of, for example, conductive materials such as tungsten and polysilicon.

As shown in FIGS. 5 to 9, the first shunt wires 113 are disposed above the trenches Tb and extend in the X-direction. In addition, each first shunt wire 113 is in contact, at its bottom surface, with the upper ends of the source contact wires 112 arranged in the X-direction. In addition, as shown in FIG. 8, the first shunt wires 113 are in contact, at their top surfaces, to the contacts 114. The first shunt wires 113 are thus connected to the second shunt wires 115 via the contacts 114. Therefore, the second shunt wires 115 are positioned above certain contact wires among the source contact wires 112. Specifically, the second shunt wires 115 and the certain source contact wires 112 are in an overlapping position in the X direction. On the other side, the second shunt wires 115 are not positioned above the other source contact wires 112 among the source contact wires 112. Specifically, the second shunt wires 115 and the other source contact wires 112 are not in an overlapping position in the X direction. Note that the first shunt wires 113, the contacts 114, and the second shunt wires 115 are formed of, for example, conductive materials such as tungsten and polysilicon.

Figure 10:
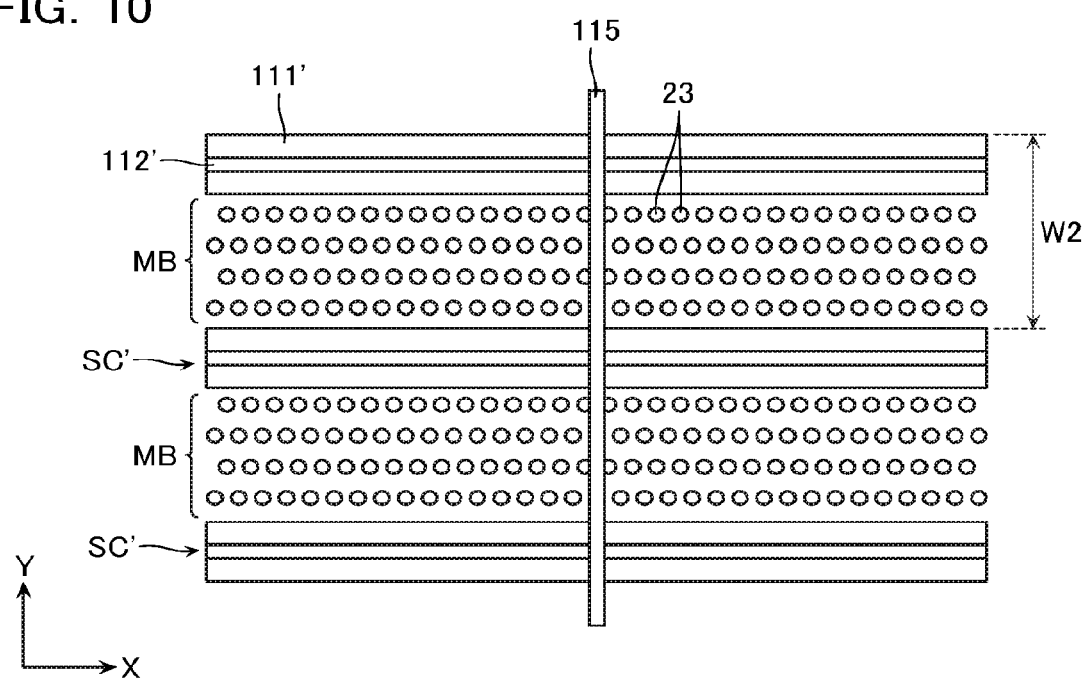
FIG. 10 is a schematic plan view of a semiconductor memory device according to a first comparative example.
Figure 11:
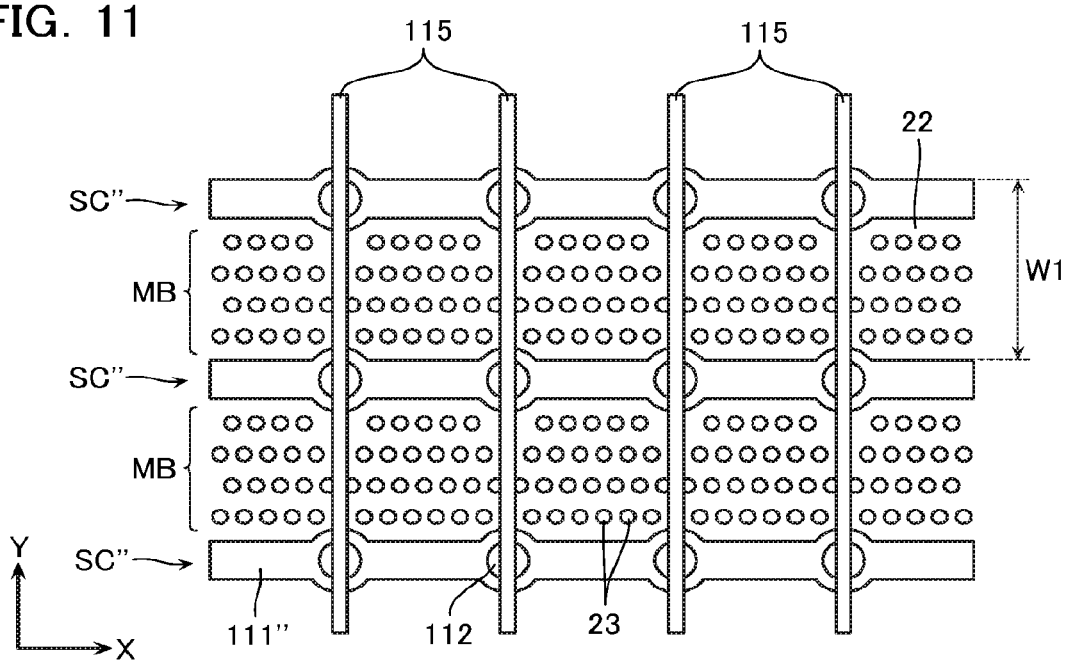
FIG. 11 is a schematic plan view of a semiconductor memory device according to a second comparative example.

Next, for comparison, with reference to FIGS. 10 and 11, semiconductor memory devices according to first and second comparative examples will be described. FIGS. 10 and 11 are schematic plan views of the semiconductor memory devices according to the first and second comparative examples.

As shown in FIG. 10, the semiconductor memory device according to the first comparative example is configured basically similarly to the semiconductor memory device according to the first embodiment. In the semiconductor memory device according to the first comparative example, however, source contact wires 112' are formed in a plane and the source contact wires 112' and the trenches Tb have interblock insulating layers 111' embedded therebetween. In addition, the interblock insulating layers 111' have a film thickness at least large enough to be able to isolate the source contact wires 112' and the conductive films 21.

Therefore, in the first comparative example, the source contact lead-out portions SC' have a Y-direction width similar to the width of the source contact lead-out portions SC according to the first embodiment in the portion where the source contact wires 112 are positioned. Therefore, in the first comparative example, the same number of semiconductor layers 23 disposed in the memory block MB will increase the combined Y-direction width W2 of the source contact lead-out portion SC' and the memory block MB.

As shown in FIG. 11, the semiconductor memory device according to the second comparative example is configured basically similarly to the semiconductor memory device according to the first embodiment. In the semiconductor memory device according to the second comparative example, however, the first shunt wires 113 are not provided that each commonly connect the source contact wires 112 arranged in the X-direction and the source contact wires 112 are directly connected to the second shunt wires 115. Therefore, the semiconductor memory device according to the second comparative example includes the same number of second shunt wires 115 as the source contact wires 112 positioned in the source contact lead-out portions SC".

Here, as described with reference to FIG. 2, the second shunt wires 115 are provided in the same wiring layer as the bit-lines BL. In other words, the second shunt wires 115 and the bit-lines BL have the same Z-direction position. Therefore, the more is the number of second shunt wires 115, the more is the area of the wiring layer where the bit-lines BL and the second shunt wires 115 are positioned.

Here, as described with reference to FIGS. 6 to 9, the semiconductor memory device according to this embodiment includes the source contact wires 112 that are arranged in the X-direction at a certain distance and extend in the Z-direction. Therefore, the trenches Tb may be partially thinly formed to project portions of the conductive layers 22 and dispose the semiconductor layers 23 near the projected portions 222. Therefore, the combined Y-direction width W1 of the source contact lead-out portion SC and the memory block MB may be reduced, thus finely configuring the semiconductor memory device.

In addition, in the semiconductor memory device according to this embodiment, each first shunt wire 113 commonly connects the source contact wires 112 arranged in the X-direction. Therefore, the first shunt wires 113 may be connected to the second shunt wires 115 to reduce the number of second shunt wires 115 and reduce the area of the wiring layer where the bit-lines BL and the second shunt wires 115 are positioned, thus finely configuring the semiconductor memory device.

Second Embodiment

Figure 12:
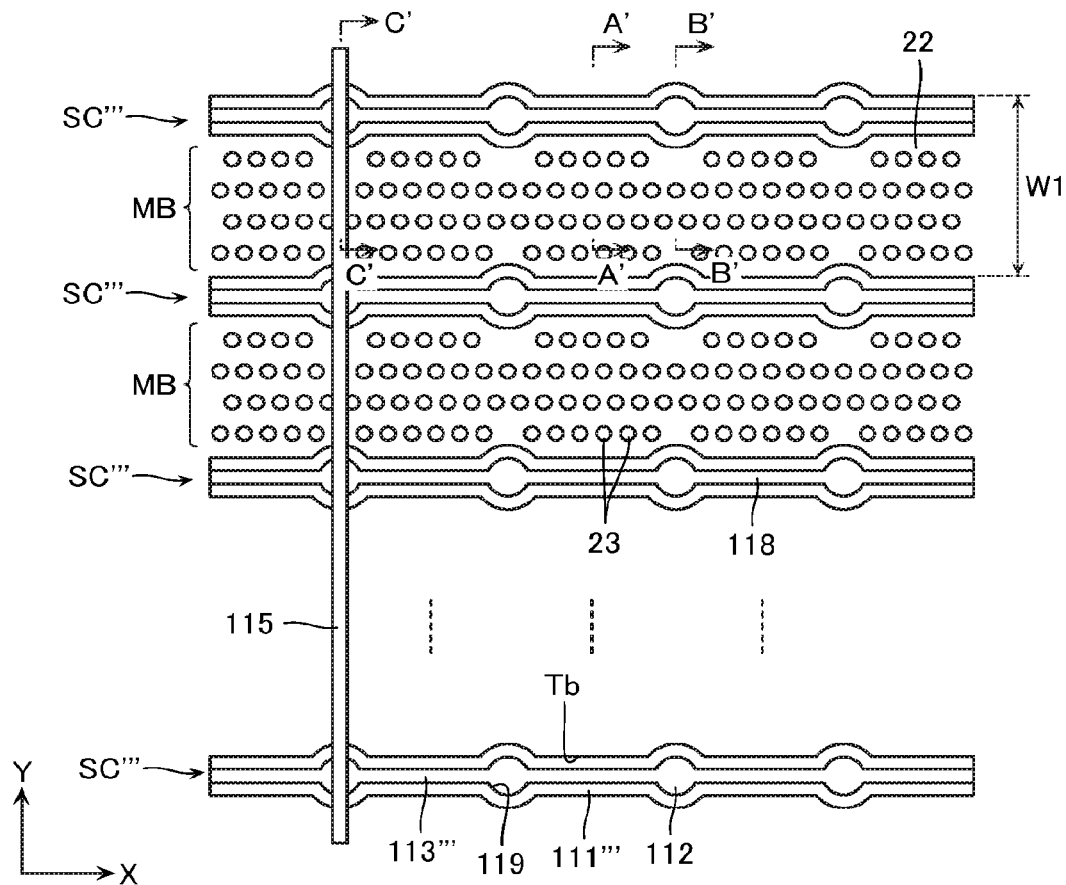
FIG. 12 is a schematic plan view of a semiconductor memory device according to a second embodiment.
Figure 13:
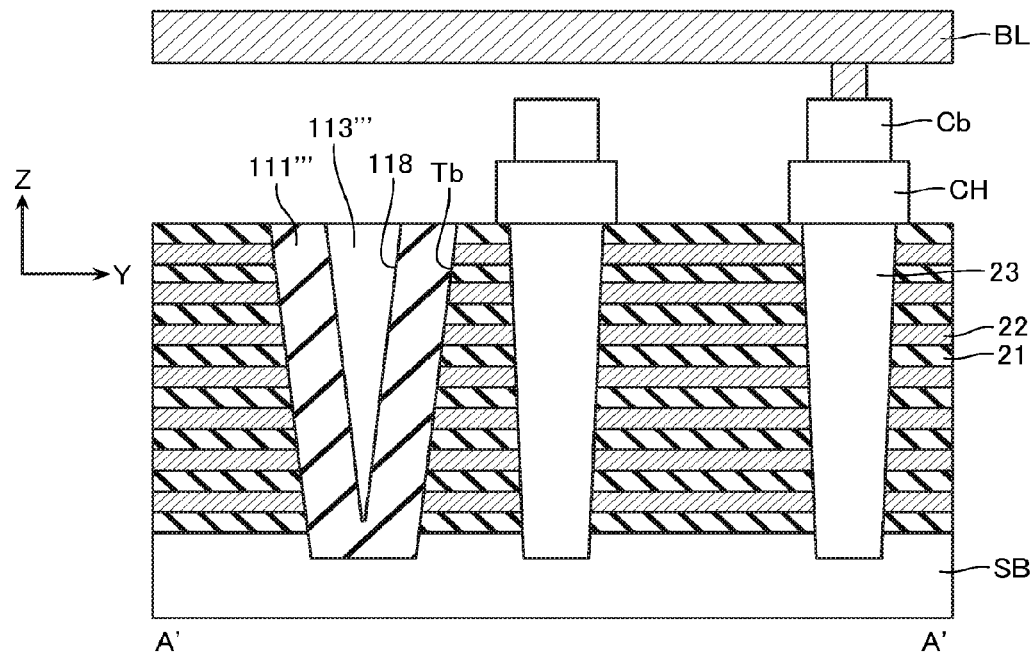
FIG. 13 is a cross-sectional view showing a section along A'-A' in FIG. 12.
Figure 14:
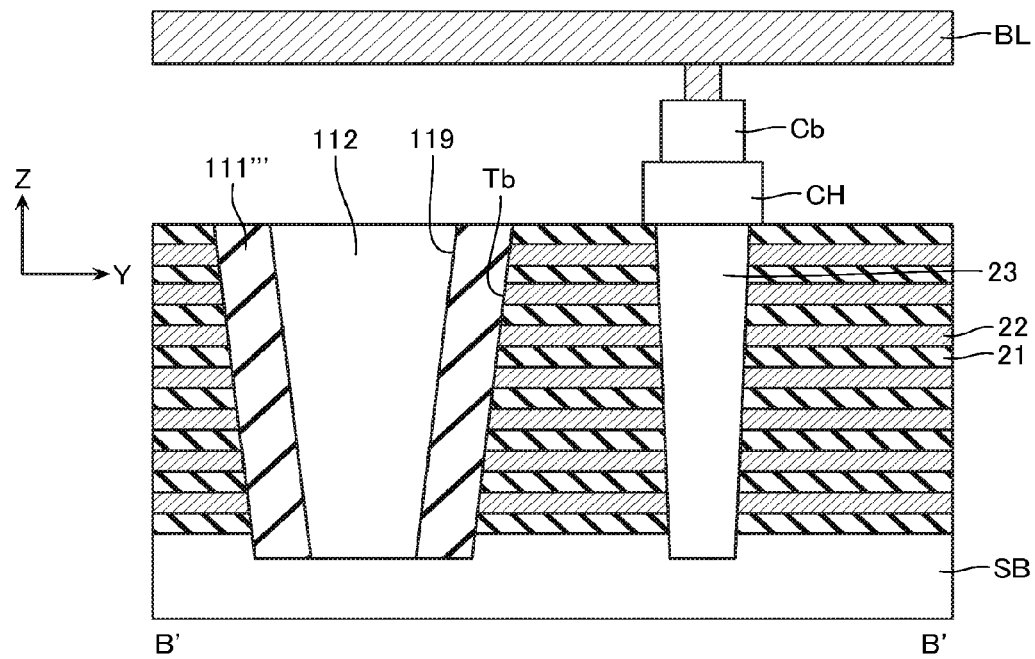
FIG. 14 is a cross-sectional view showing a section along B'-B' in FIG. 12.
Figure 15:
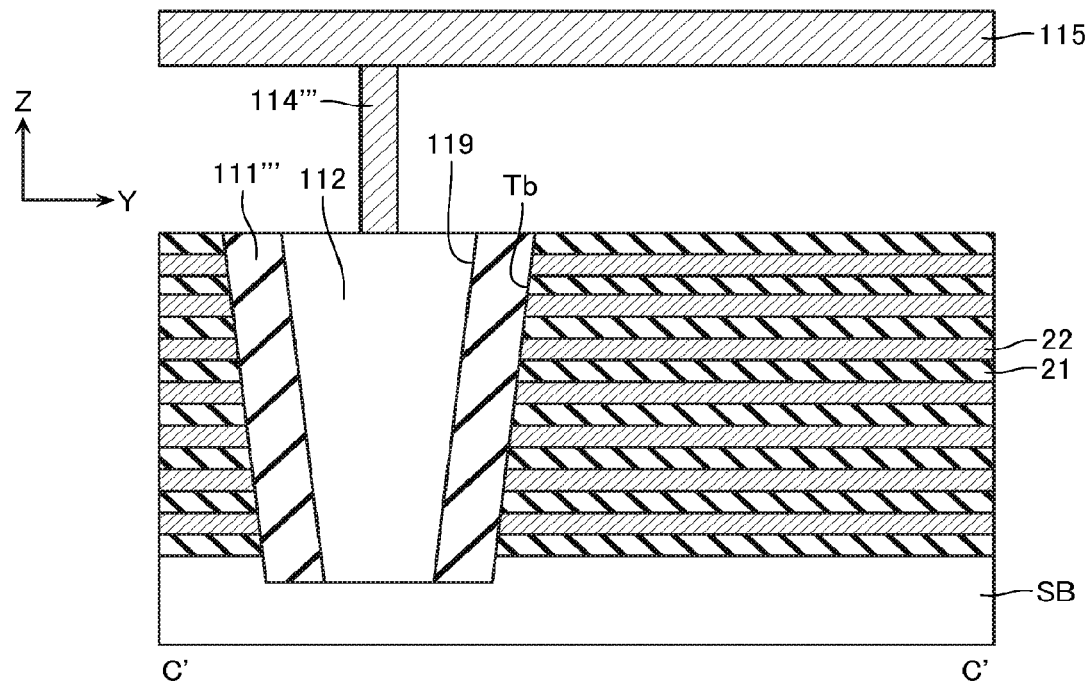
FIG. 15 is a cross-sectional view showing a section along C'-C' in FIG. 12.

Next, with reference to FIGS. 12 to 15, a semiconductor memory device according to a second embodiment will be described. FIG. 12 is a schematic plan view of the semiconductor memory device according to this embodiment. FIG. 13 is a cross-sectional view showing a section along A'-A' in FIG. 12. FIG. 14 is a cross-sectional view showing a section along B'-B' in FIG. 12. FIG. 15 is a cross-sectional view showing a section along C'-C' in FIG. 12. Note that in the following discussion, like elements as those in the first embodiment are designated with like reference numerals and their description is omitted here.

As shown in FIGS. 12 to 15, the semiconductor memory device according to this embodiment is configured basically similarly to the semiconductor memory device according to the first embodiment. In this embodiment, however, as shown in FIG. 13, interblock insulating layers 111''' have grooves 118 formed on their top surfaces and first shunt wires 113''' are positioned inside the grooves 118. In addition, as shown in FIG. 15, source contact wires 112 are in contact, at their upper ends, with contacts 114''' and connected to second shunt wires 115 via the contacts 114'''. Specifically, as shown in FIGS. 13 to 15, this embodiment does not have wiring lines formed above the interblock insulating layers 111'''.

As shown in FIG. 13, each groove 118 has two surfaces parallel to the side walls of the interblock insulating layers 111''' (the Y-direction side walls of the memory blocks MB and the side walls of the trenches Tb). Therefore, the first shunt wires 113''' embedded in the grooves 118 are formed in a triangle in the Y Z-plane and formed in a triangular prism extending in the X-direction. Note that the top surfaces of the first shunt wires 113''' have the same height as the top surfaces of the interblock insulating layers 111''' and the source contact wires 112.

Figure 16:
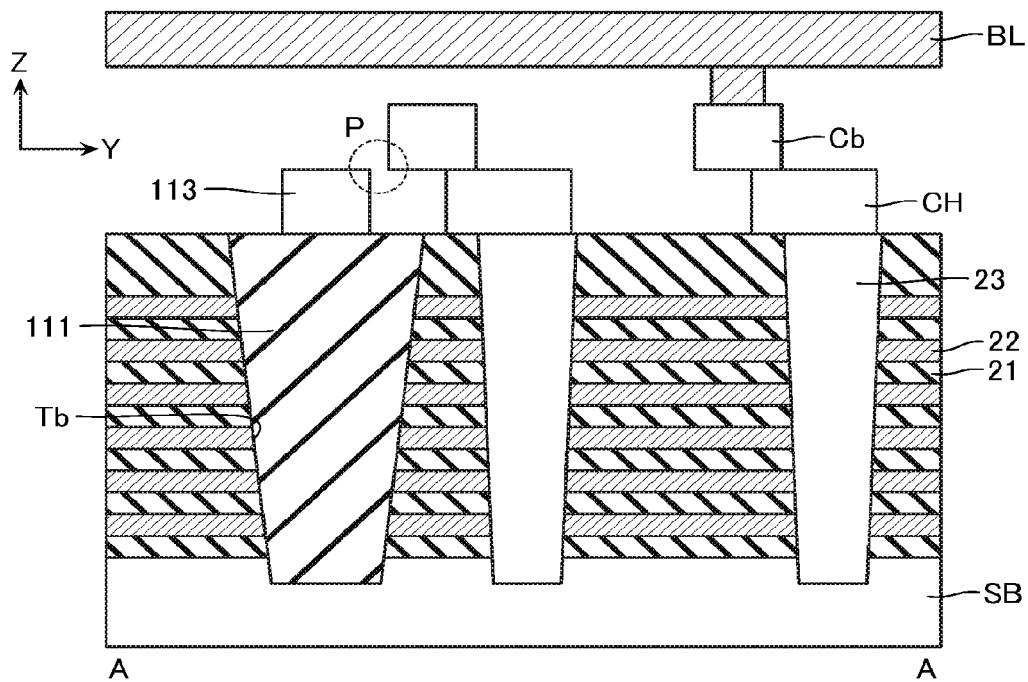
FIG. 16 is a schematic cross-sectional view of a semiconductor memory device according to a third comparative example.

Next, for comparison, with reference to FIG. 16, a semiconductor memory device according to a third comparative example will be described. FIG. 16 is a schematic plan view of the semiconductor memory device according to the third comparative example.

As shown in FIG. 16, the semiconductor memory device according to the third comparative example is configured basically similarly to the semiconductor memory device according to the first embodiment. In the semiconductor memory device according to the third comparative example, however, the positions of the upper and lower contacts Cb and CH are shifted in the Y-direction. Thus, as shown by P in FIG. 16, the first shunt wires 113 and the upper contacts Cb are too close.

Here, as described above, the first shunt wires 113 are connected to the second shunt wires 115 and set to the ground potential, for example, during the write and read operations. In addition, as described above, the upper contacts Cb are connected to the bit-lines BL and applied with a relatively large voltage during the write and read operations. Therefore, the first shunt wires 113 and the upper contacts Cb are likely to have a relatively large potential difference therebetween. Therefore, the portion shown by P in FIG. 16 may experience dielectric breakdown, thus short circuiting the first shunt wires 113 and the upper contacts Cb.

In this regard, as shown in FIG. 13, this embodiment has the first shunt wires 113''' embedded in the grooves 118. This may omit the wiring lines above the interblock insulating layers 111''' to prevent the short-circuit between the wiring lines as described with reference to FIG. 16.

In addition, as shown in FIG. 13, in this embodiment, each groove 118 has two surfaces parallel to the side walls of the interblock insulating layers 111'''. Therefore, insulating layers having a certain thickness formed in the tapered trenches Tb may facilitate the formation of the interblock insulating layers 111'''.

Figure 17:
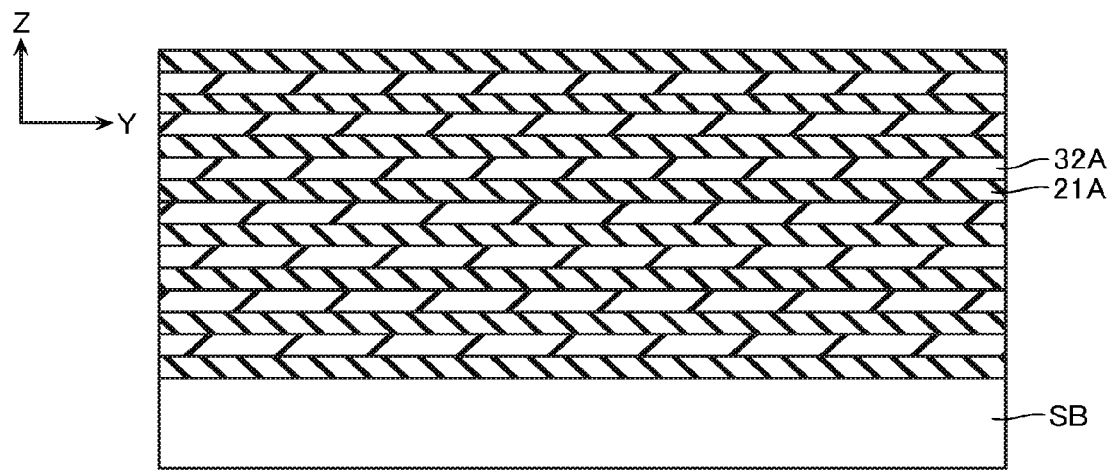
FIG. 17 is a schematic cross-sectional view for illustrating a method of manufacturing the semiconductor memory device according to the second embodiment.
Figure 30:
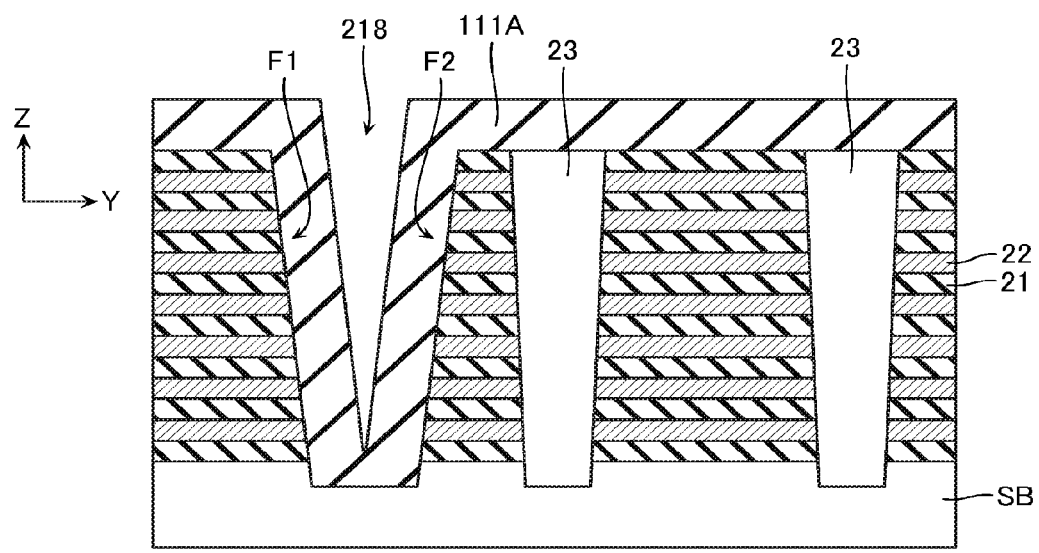
FIG. 30 is a schematic cross-sectional view for illustrating the manufacturing method.
Figure 31:
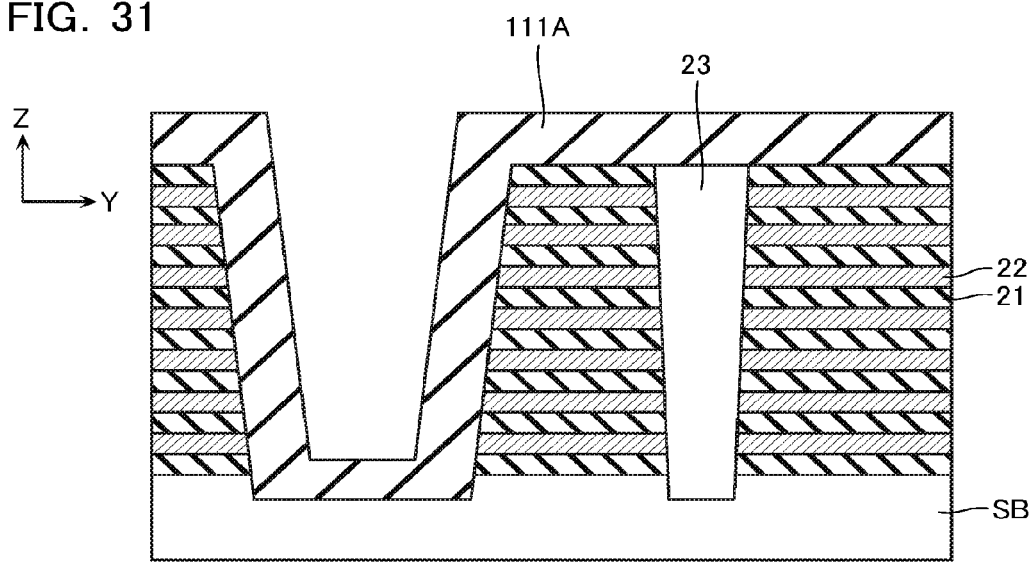
FIG. 31 is a schematic cross-sectional view for illustrating the manufacturing method.

Next, with reference to FIGS. 17 to 34, a method of manufacturing the semiconductor memory device according to this embodiment will be described. FIGS. 18, 21, 24, 27, and 32 are schematic plan views for illustrating the method of manufacturing the semiconductor memory device according to this embodiment. In addition, FIGS. 19, 22, 25, 28, and 33 are cross-sectional views showing sections along A'-A' in these plan views. Further, FIGS. 20, 23, 26, 29, and 34 are cross-sectional views showing sections along B'-B' in these plan views. Additionally, FIGS. 17, 30, and 31 are schematic cross-sectional views for illustrating the method. Note that for purposes of illustration, FIGS. 17 to 34 partially omit the configurations.

As shown in FIG. 17, in the manufacturing method according to this embodiment, a semiconductor substrate SB is provided with an alternate stack of a plurality of sacrificing layers 32A and insulating layers 21A, the layers 21A providing the interlayer insulating layers 21. Note that the insulating layers 21A are formed of, for example, silicon oxide ($SiO_2$). In addition, the sacrificing layers 32 are formed of, for example, silicon nitride (SiN).

Figure 18:
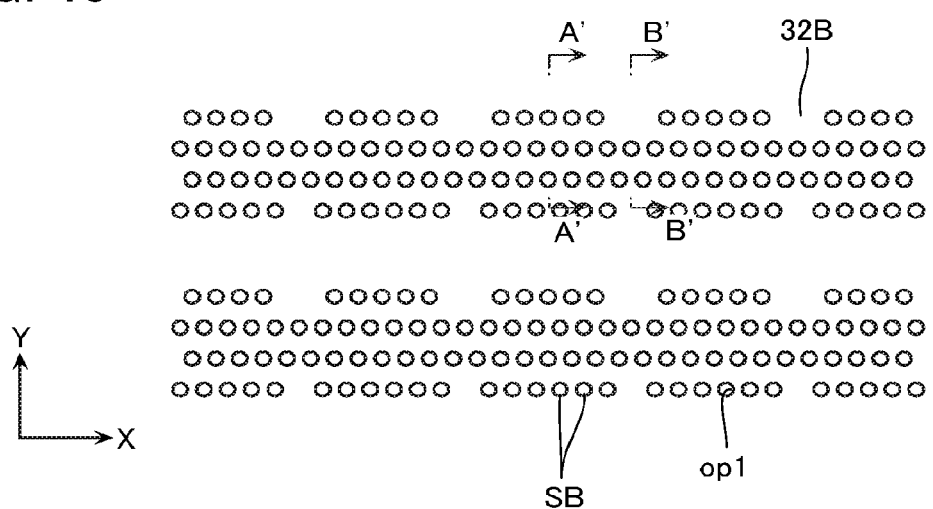
FIG. 18 is a schematic plan view for illustrating the manufacturing method.
Figure 19:
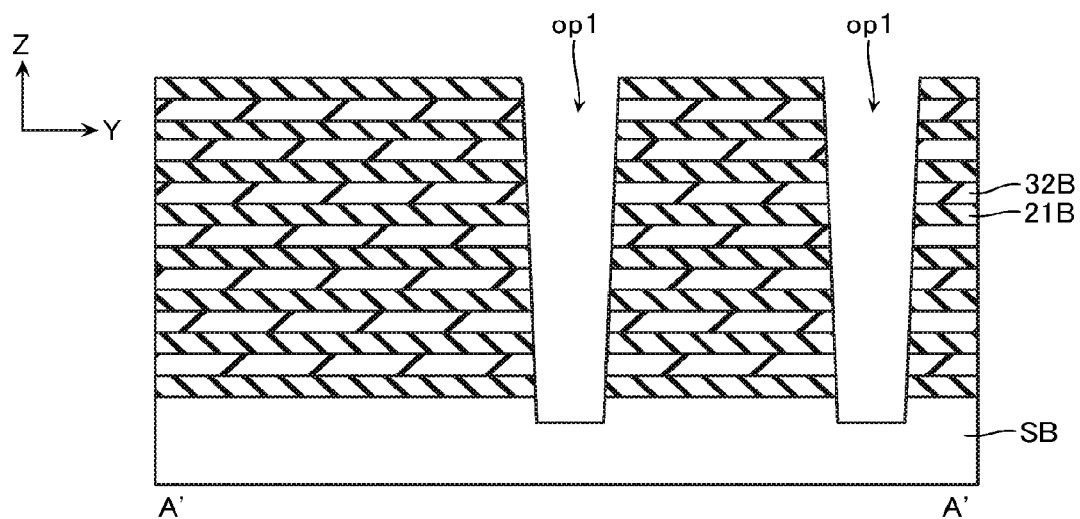
FIG. 19 is a schematic cross-sectional view for illustrating the manufacturing method.
Figure 20:
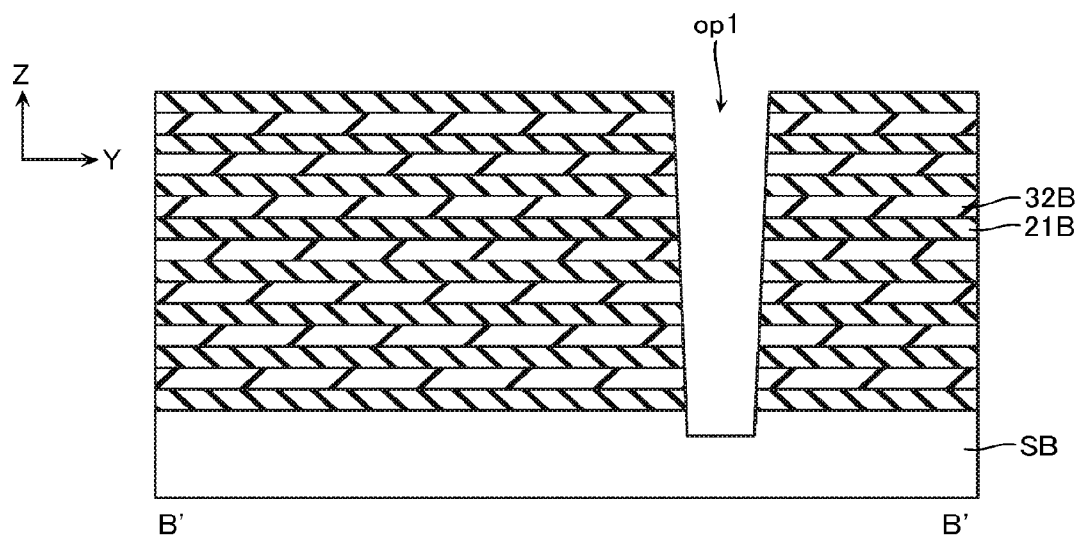
FIG. 20 is a schematic cross-sectional view for illustrating the manufacturing method.

Next, as shown in FIGS. 18 to 20, openings op1 are formed passing through the sacrificing layers 32A and the insulating layers 21A, the sacrificing layers 32B and the insulating layers 21B are formed, and the substrate SB is exposed. The openings op1 provides memory holes MH.

Figure 21:
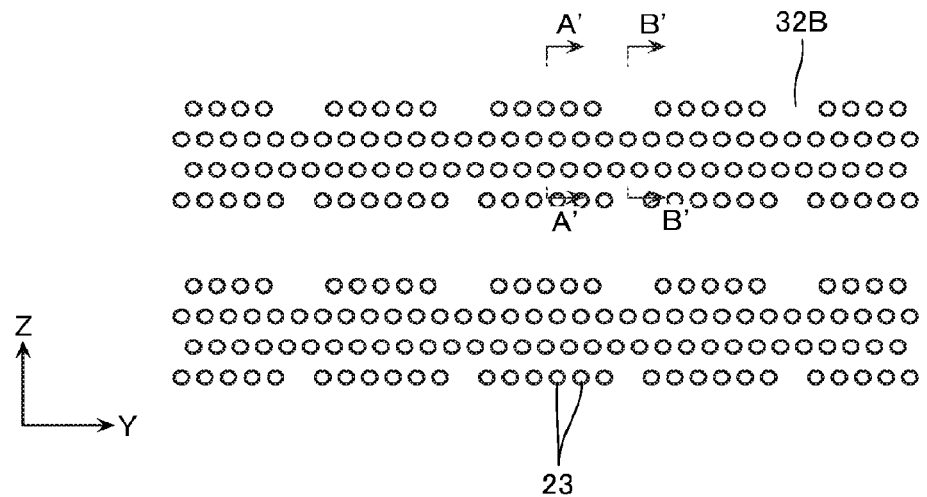
FIG. 21 is a schematic plan view for illustrating the manufacturing method.
Figure 22:
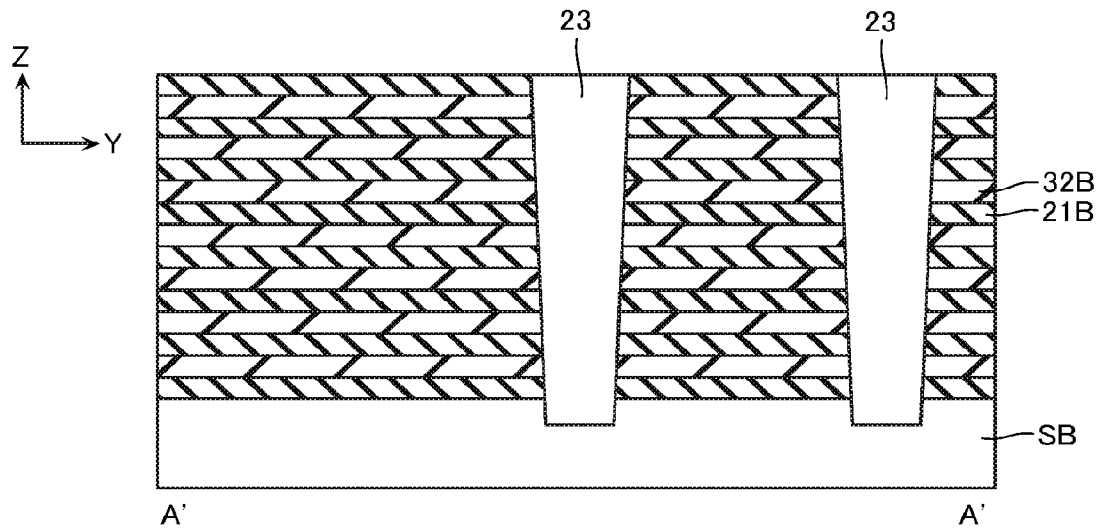
FIG. 22 is a schematic cross-sectional view for illustrating the manufacturing method.
Figure 23:
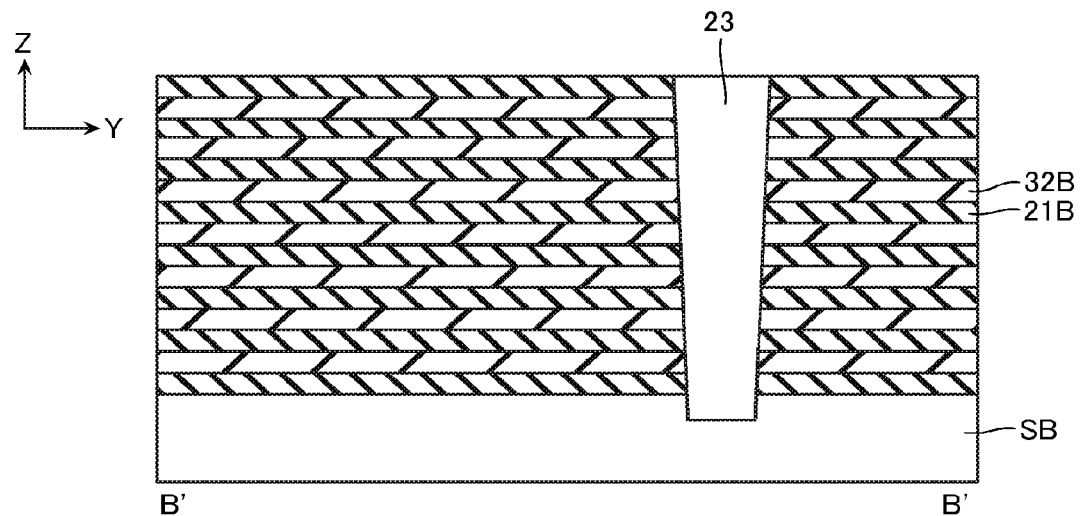
FIG. 23 is a schematic cross-sectional view for illustrating the manufacturing method.

Next, as shown in FIGS. 21 to 23, not-shown memory layers and the semiconductor layers 23 are formed in the openings op1.

Figure 24:
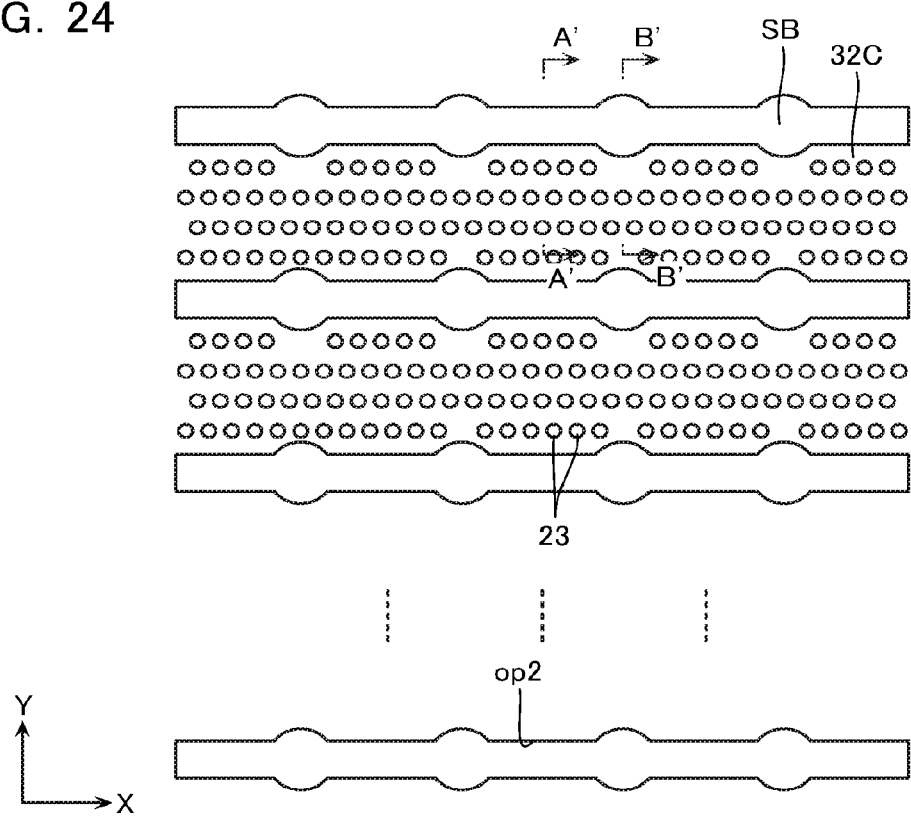
FIG. 24 is a schematic plan view for illustrating the manufacturing method.
Figure 25:
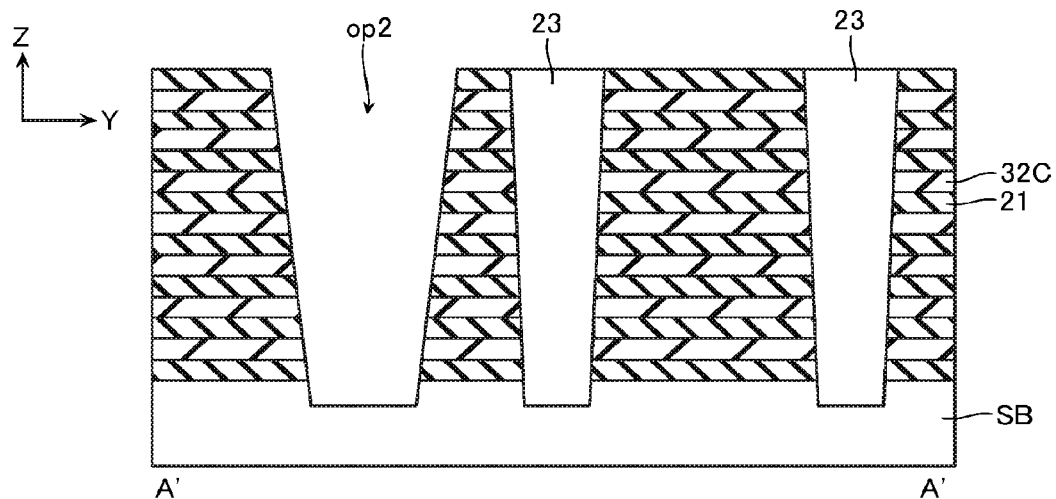
FIG. 25 is a schematic cross-sectional view for illustrating the manufacturing method.
Figure 26:
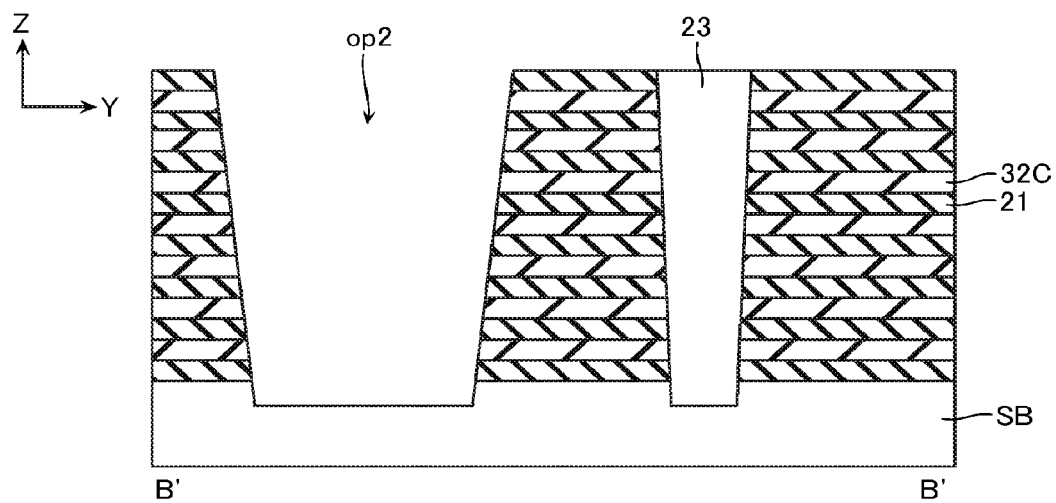
FIG. 26 is a schematic cross-sectional view for illustrating the manufacturing method.

Next, as shown in FIGS. 24 to 26, openings op2 are formed dividing the sacrificing layers 32B and the insulating layers 21B, and sacrificing layers 32C and the interlayer insulating layers 21 are formed, and the substrate SB is exposed. The openings op2 provide the trenches Tb. Note that as shown in FIG. 24, each opening op2 has a width that is relatively wider near the source contact wires 112 and relatively narrower in the other portions. In addition, the openings op2 are formed narrower as closer to the substrate SB and formed wider as farther from the substrate SB.

Figure 27:
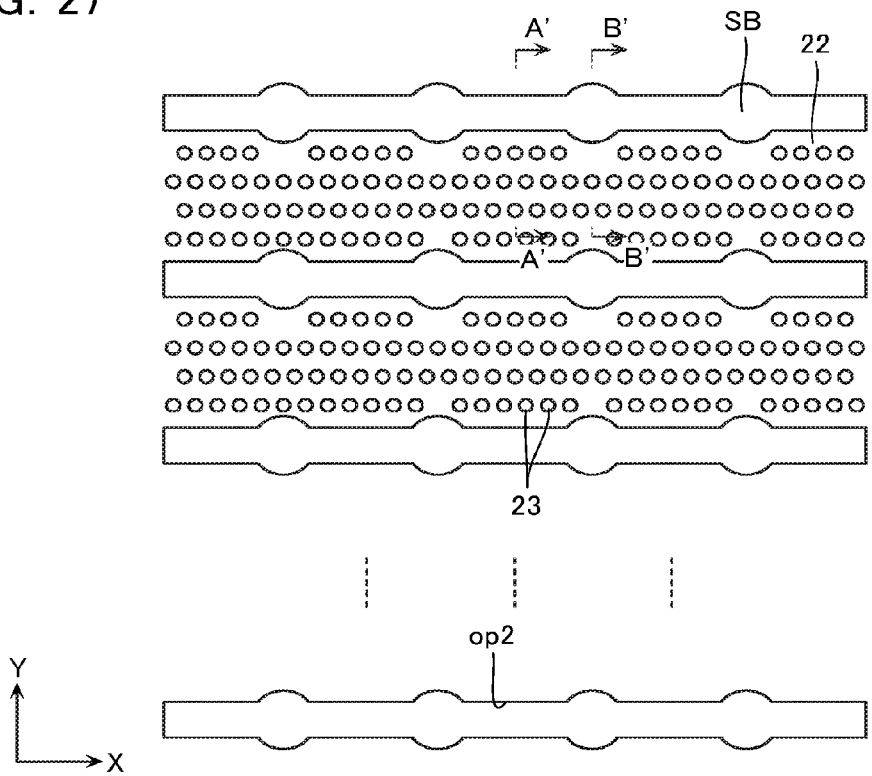
FIG. 27 is a schematic plan view for illustrating the manufacturing method.
Figure 28:
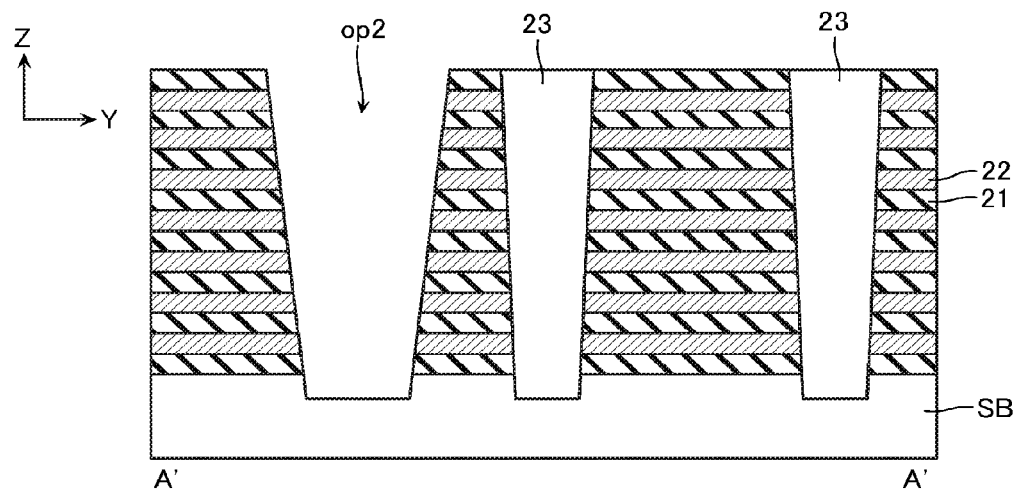
FIG. 28 is a schematic cross-sectional view for illustrating the manufacturing method.
Figure 29:
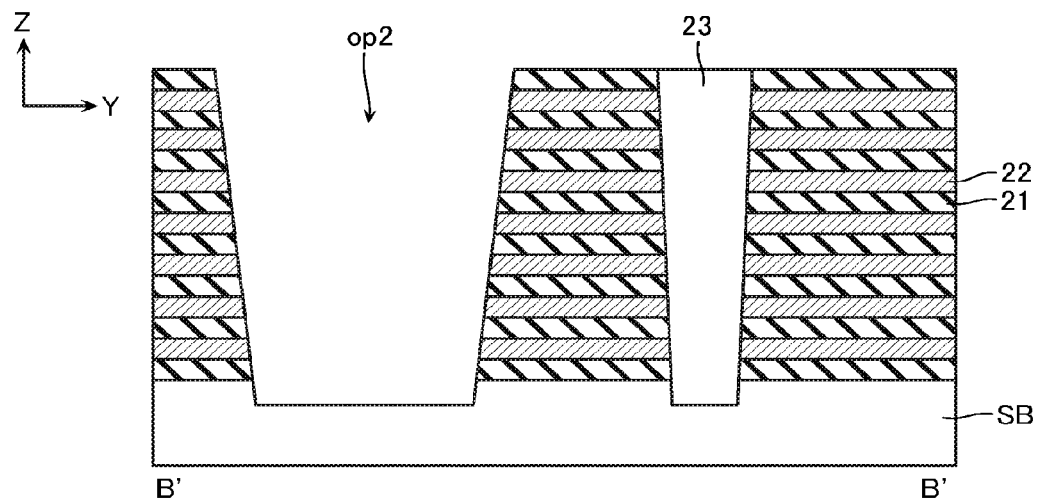
FIG. 29 is a schematic cross-sectional view for illustrating the manufacturing method.

Next, as shown in FIGS. 27 to 29, the sacrificing layers 32 are removed via the openings op2, and stacked films (not shown in FIGS. 27 to 29) providing the stacked films CF and the conductive layers 22 are formed. The sacrificing layers 32 are removed by, for example, wet etching using a phosphoric acid solution.

Next, as shown in FIGS. 30 and 31, insulating layers 111A are deposited in the openings op2, the insulating layers 111A providing the interblock insulating layers 111'''. As shown in FIGS. 30 and 31, this process deposits the insulating layers 111A also on the top surfaces of the top interlayer insulating layers 21 and on the semiconductor layers 23. Note that, as shown in FIG. 30, each opening op2 has first and second side surfaces F1 and F2, the insulating layers 111A are deposited such that the first and second side surfaces F1 and F2 are provided with respective first and second portions of each insulating layer 111A, the first and second portions form a groove 218, and the lower end of the groove 218 is lower than the top surface of the top interlayer dielectric film 21 (the top surface of the interlayer dielectric film 21 farthest from the substrate SB). Thus, the grooves 218 providing the grooves 118 are formed.

Figure 32:
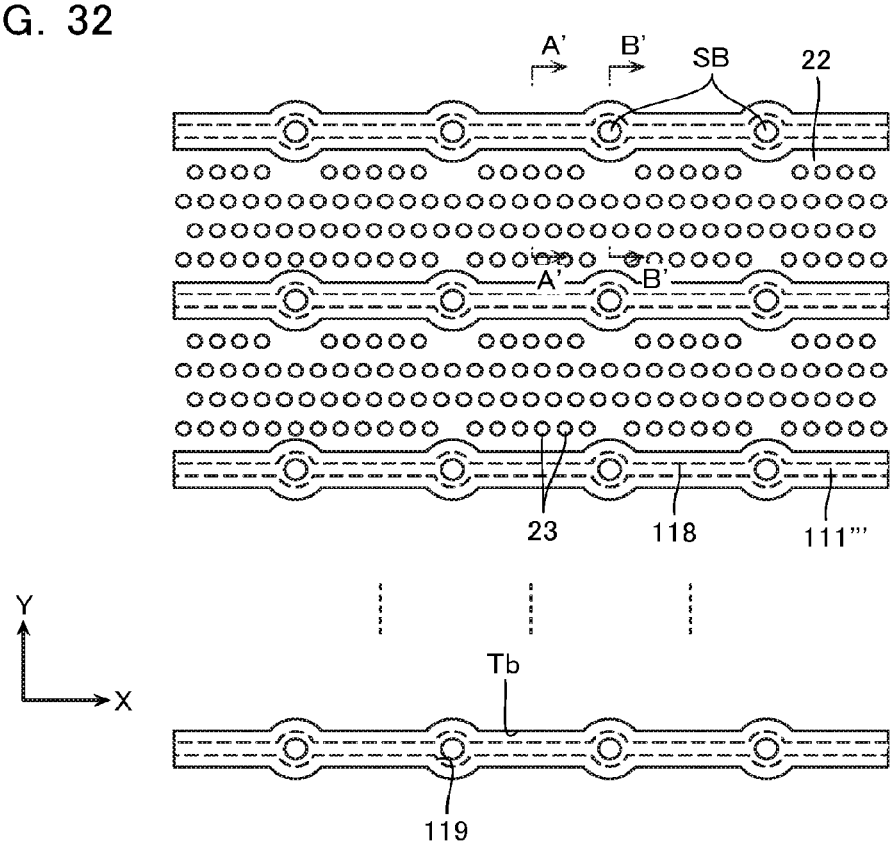
FIG. 32 is a schematic plan view for illustrating the manufacturing method.
Figure 33:
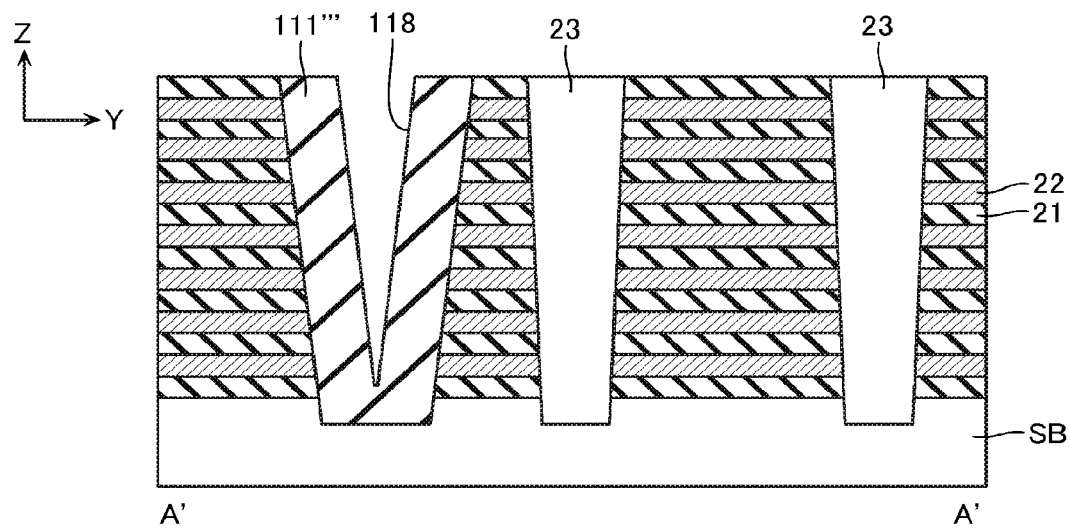
FIG. 33 is a schematic cross-sectional view for illustrating the manufacturing method.
Figure 34:
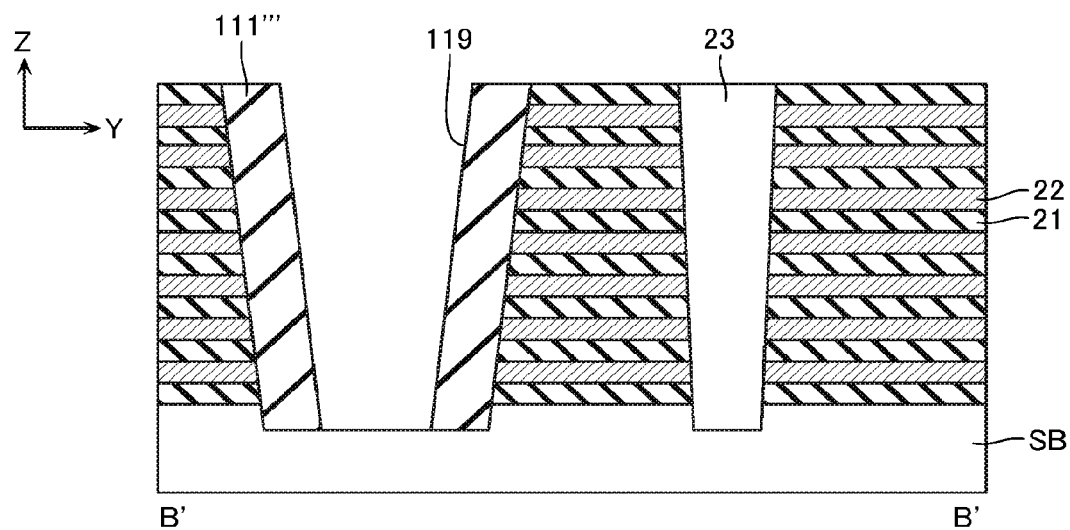
FIG. 34 is a schematic cross-sectional view for illustrating the manufacturing method.

Next, as shown in FIGS. 32 to 34, the insulating layers 111A are partially removed to form the insulating layers 111''' This process removes, as shown in FIGS. 32 and 34, the bottom surfaces of the portions of the insulating layers 111A that form the cylindrical portions. The substrate SB is thus exposed. In addition, as shown in FIGS. 32 to 34, this process removes the portions of the insulating layers 111A that are on the top surfaces of the top interlayer insulating layers 22 and on the top surfaces of the semiconductor layers 23.

Then, the conductive layers are embedded, and means such as CMP using the insulating layers 21 or the like as a stopper is used to remove the portions of the conductive layers that are higher than the upper ends of the insulating layers 111A, thus forming the source contact wires 112 and the first shunt wires 113'''. The contacts 114, the upper and lower contacts Cb and CH, as well as the bit-lines BL, the second shunt wires 115, and the like are also formed. The semiconductor memory device according to this embodiment is thus formed.

Note that the conductive layers may be embedded before the insulating layers 111A are partially removed. In addition, as described above, the substrate SB is provided with an alternate stack of the sacrificing layers 32 and interlayer insulating layers 21, the openings op2 are formed, and then the sacrificing layers are removed, followed by formation of the conductive layers 22. However, the interlayer insulating layers 21 and the conductive layers 22 may also be alternately stacked on the substrate SB, for example.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Figure 35:
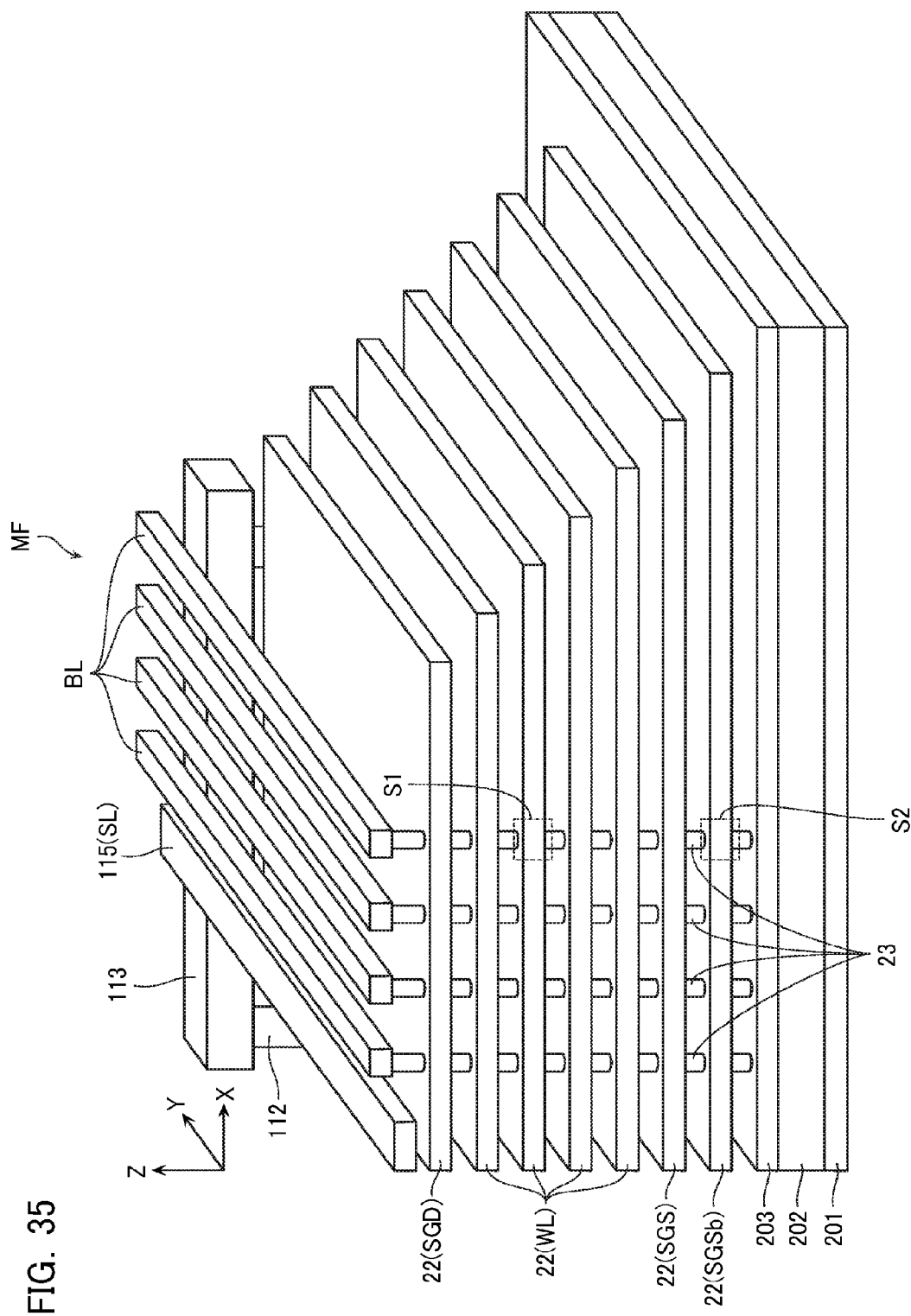
FIGS. 35 and 36 shows modified examples of the embodiments.

FIG. 35 shows one of the modified examples of the above-described embodiments. In FIG. 35, like elements as those in FIG. 2 are designated with like reference numerals and their description is omitted here. In this modified example, a circuit layer 202 is provided on a substrate 201, and a conductive layer 203 is further disposed thereon. The circuit layer 202 includes a transistor and wiring layers, for example. The conductive layer 203 includes a semiconductor layer such as polysilicon, and a metal layer such as tungsten or the like. The conductive layer 203 is connected to lower ends of the semiconductor layers 23.

Figure 36:
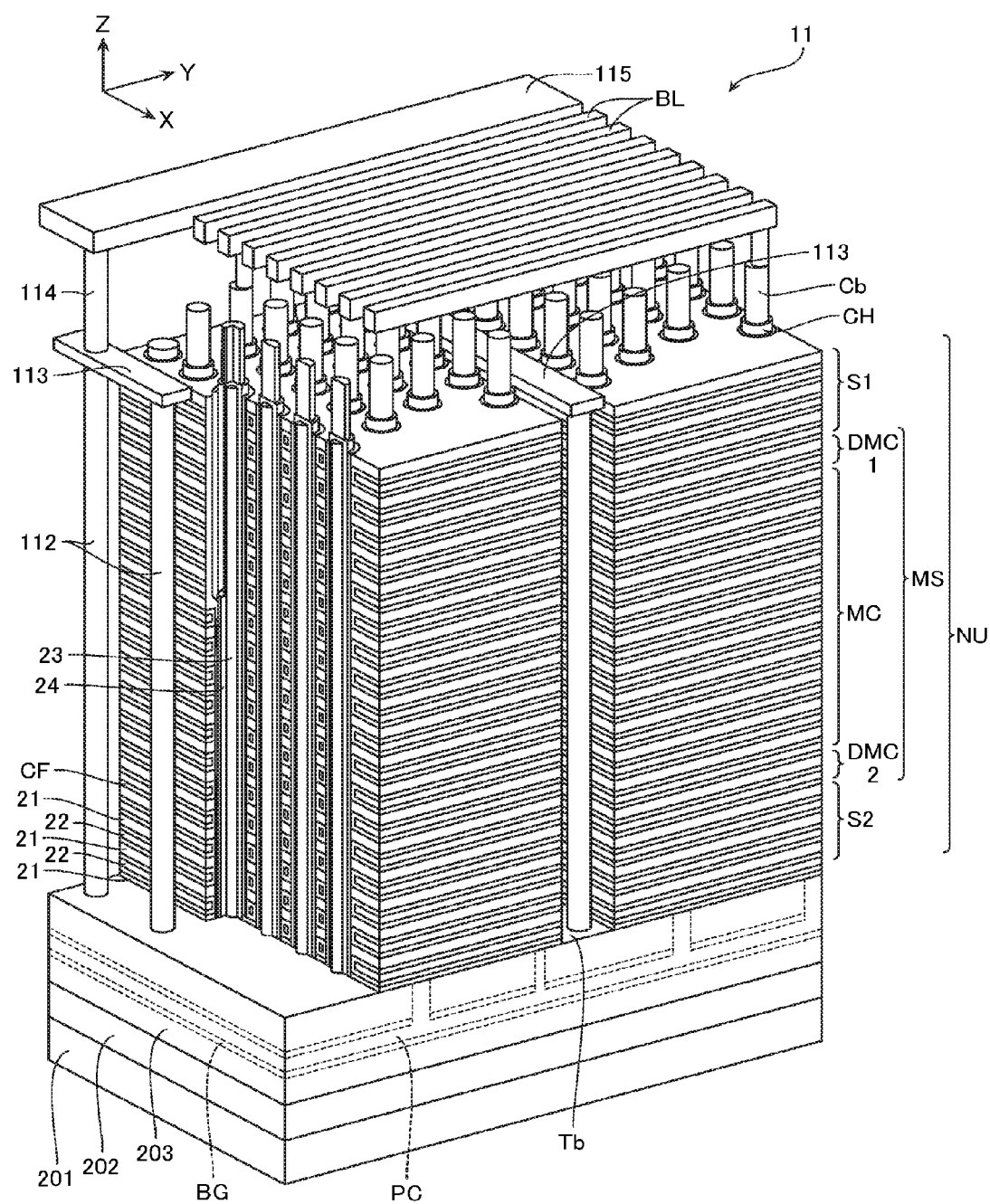

FIG. 36 shows another modified example of the above-described embodiments. In this modified example, formed inside the semiconductor layer 203 is a back gate line BG and a wiring layer PC. The wiring layer PC connects the lower ends of the semiconductor layers 23 and the source contact wires 112. The back gate line BG is formed around the wiring layer PC via a not-shown gate insulation film. Applying a gate voltage to the back gate line BG may allow a channel to be formed in the wiring layer PC, thus renders the wiring layer PC conductive.

What is claimed is:

1. A semiconductor memory device comprising:
 a first layer;
 a plurality of memory areas provided on the first layer in a first direction;
 a plurality of contact wires, the contact wires having a longitudinal direction in a second direction perpendicular to the first layer, the contact wires being provided between the adjacent memory areas on the first layer in a third direction intersecting the first direction;
a first shunt wire commonly connecting the contact wires;
a second shunt wire extending in the first direction, the second shunt wire being electrically connected to the first shunt wire; and
interblock insulating layers positioned between side walls of the memory areas and side walls of the contact wires, wherein
each interblock insulating layer has a groove extending in the third direction, and the first shunt wire is positioned inside the groove.

2. The semiconductor memory device according to claim 1, wherein
each memory area comprises:
a plurality of first wiring lines stacked in the second direction at a certain distance;
a semiconductor layer having a longitudinal direction in the second direction, the semiconductor layer having a first end connected to the first layer; and
a charge accumulation layer provided between the first wiring lines and the semiconductor layer.

3. The semiconductor memory device according to claim 2, further comprising a second wiring line extending in the first direction, the second wiring line being electrically connected to a second end of the semiconductor layer, wherein
the second shunt wire has the same second-direction position as the second wiring line.

4. The semiconductor memory device according to claim 2, wherein
the first wiring line has an end portion in the first direction, the end portion being recessed in the first direction near the contact wires.

5. A semiconductor memory device comprising:
a first layer;
a plurality of memory areas provided on the first layer in a first direction;
a plurality of contact wires, the contact wires having a longitudinal direction in a second direction perpendicular to the first layer, the contact wires being provided between the adjacent memory areas on the first layer in a third direction intersecting the first direction;
a first shunt wire commonly connecting the contact wires; and
a second shunt wire extending in the first direction, the second shunt wire being electrically connected to the first shunt wire, wherein
the second shunt wire is positioned above a certain contact wire among the contact wires and the second shunt wire and the certain contact wire are in an overlapping position in the third direction.

6. The semiconductor memory device according to claim 5, wherein
the second shunt wire and contact wires other than the certain contact wire among the contact wires are not in an overlapping position in the third direction.

7. A semiconductor memory device comprising:
a first layer;
a plurality of memory areas provided on the first layer in a first direction;
a plurality of contact wires, the contact wires having a longitudinal direction in a second direction perpendicular to the first layer, the contact wires being provided between the adjacent memory areas on the first layer in a third direction intersecting the first direction,
a first shunt wire commonly connecting the contact wires;
a second shunt wire extending in the first direction, the second shunt wire being electrically connected to the first shunt wire, wherein
two memory areas adjacent in the first direction are apart by a first distance in portions where they are in an overlapping position with the contact wires in the third direction, and apart by a second distance smaller than the first distance in portions where they are not in an overlapping position with the contact wires in the third direction.

8. The semiconductor memory device according to claim 5, wherein each memory area comprises:
a plurality of first wiring lines stacked in the second direction at a certain distance;
a semiconductor layer having a longitudinal direction in the second direction, the semiconductor layer having a first end connected to the first layer; and
a charge accumulation layer provided between the first wiring lines and the semiconductor layer.

9. The semiconductor memory device according to claim 8, further comprising a second wiring line extending in the first direction, the second wiring line being electrically connected to a second end of the semiconductor layer, wherein
the second shunt wire has the same second-direction position as the second wiring line.

10. The semiconductor memory device according to claim 8, wherein
the first wiring line has an end portion in the first direction, the end portion being recessed in the first direction near the contact wires.

11. The semiconductor memory device according to claim 7, wherein each memory area comprises:
a plurality of first wiring lines stacked in the second direction at a certain distance;
a semiconductor layer having a longitudinal direction in the second direction, the semiconductor layer having a first end connected to the first layer; and
a charge accumulation layer provided between the first wiring lines and the semiconductor layer.

12. The semiconductor memory device according to claim 11, further comprising a second wiring line extending in the first direction, the second wiring line being electrically connected to a second end of the semiconductor layer, wherein
the second shunt wire has the same second-direction position as the second wiring line.

13. The semiconductor memory device according to claim 11, wherein
the first wiring line has an end portion in the first direction, the end portion being recessed in the first direction near the contact wires.

* * * * *